US012615752B2

(12) United States Patent
Sharma et al.

(10) Patent No.: US 12,615,752 B2
(45) Date of Patent: Apr. 28, 2026

(54) STACKED SRAM WITH SHARED WORDLINE CONNECTION

(71) Applicant: Intel Corporation, Santa Clara, CA (US)

(72) Inventors: Abhishek Anil Sharma, Portland, OR (US); Wilfred Gomes, Portland, OR (US); Tahir Ghani, Portland, OR (US); Anand Murthy, Portland, OR (US); Rajabali Koduri, Saratoga, CA (US); Clifford Ong, Portland, OR (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 727 days.

(21) Appl. No.: 17/856,870

(22) Filed: Jul. 1, 2022

(65) Prior Publication Data

US 2024/0008239 A1     Jan. 4, 2024

(51) Int. Cl.
| | |
|---|---|
| *H10D 89/10* | (2025.01) |
| *G11C 11/412* | (2006.01) |
| *G11C 11/415* | (2006.01) |
| *G11C 11/419* | (2006.01) |
| *H10B 10/00* | (2023.01) |
| *G11C 5/02* | (2006.01) |
| *G11C 11/16* | (2006.01) |
| *G11C 11/413* | (2006.01) |

(52) U.S. Cl.
CPC ............ *H10B 10/12* (2023.02); *G11C 11/412* (2013.01); *G11C 11/415* (2013.01); *G11C 11/419* (2013.01); *H10B 10/15* (2023.02);

*H10D 89/10* (2025.01); *G11C 5/025* (2013.01); *G11C 11/1653* (2013.01); *G11C 11/413* (2013.01); *H10B 10/125* (2023.02)

(58) Field of Classification Search
None
See application file for complete search history.

(56) References Cited

U.S. PATENT DOCUMENTS

| | | | |
|---|---|---|---|
| 5,028,988 A | 7/1991 | Porter et al. | |
| 5,943,567 A * | 8/1999 | Chang | H10B 10/15 |
| | | | 438/238 |
| 11,665,877 B1 * | 5/2023 | Zhang | G11C 11/417 |
| | | | 365/156 |
| 12,191,270 B2 * | 1/2025 | Wang | H01L 21/76877 |
| 2003/0227041 A1 * | 12/2003 | Atwood | G11C 11/406 |
| | | | 257/908 |
| 2015/0019802 A1 * | 1/2015 | Kamal | G11C 7/1072 |
| | | | 711/104 |

(Continued)

*Primary Examiner* — Amir Zarabian
*Assistant Examiner* — Justin Bryce Heisterkamp
(74) *Attorney, Agent, or Firm* — Essential Patents Group, LLP

(57) ABSTRACT

Stacked static random-access memory (SRAM) circuits have doubled word length for a given SRAM cell area. An integrated circuit (IC) die includes stacked SRAM cells in vertically adjacent device layers with access transistors connected to a common wordline. The IC die with stacked SRAM cells having a common word line may be attached to a substrate and coupled to a power supply and, advantageously, to an active-cooling structure. SRAM cells may be formed in vertically adjacent layers of a substrate and electrically connected at their access transistor gate electrodes.

20 Claims, 15 Drawing Sheets

(56)  References Cited

U.S. PATENT DOCUMENTS

| | | | |
|---|---|---|---|
| 2016/0049197 A1* | 2/2016 | Park | G11C 8/14 |
| | | | 365/148 |
| 2019/0348112 A1* | 11/2019 | Gopinath | G11C 11/005 |
| 2020/0035683 A1* | 1/2020 | Sharma | H10D 30/6729 |
| 2020/0135266 A1* | 4/2020 | Kumar | H10D 1/68 |
| 2020/0185392 A1* | 6/2020 | Makosiej | G11C 5/063 |
| 2020/0257604 A1* | 8/2020 | Roh | G06F 11/3058 |
| 2021/0082776 A1* | 3/2021 | Wong | H01L 22/14 |
| 2021/0257370 A1 | 8/2021 | Son | |
| 2021/0296445 A1 | 9/2021 | Lee et al. | |
| 2021/0358891 A1 | 11/2021 | Chuang et al. | |
| 2021/0366819 A1* | 11/2021 | Chiang | H01L 23/445 |
| 2022/0013523 A1 | 1/2022 | Cheng | |
| 2022/0085161 A1 | 3/2022 | Noh et al. | |
| 2022/0093593 A1 | 3/2022 | Yang | |
| 2022/0130853 A1 | 4/2022 | Sharangpani et al. | |
| 2022/0190129 A1* | 6/2022 | Wei | H10D 62/235 |
| 2022/0308995 A1* | 9/2022 | Gomes | G11C 11/40607 |
| 2022/0336474 A1* | 10/2022 | Liaw | H10D 62/121 |
| 2022/0359444 A1* | 11/2022 | Cantaloube | H01L 24/13 |
| 2023/0056640 A1* | 2/2023 | Sharma | G11C 11/005 |
| 2023/0067765 A1* | 3/2023 | Sharma | H01L 24/80 |
| 2023/0085033 A1 | 3/2023 | Xie et al. | |
| 2023/0090092 A1 | 3/2023 | Lilak et al. | |
| 2023/0114024 A1 | 4/2023 | Gardner et al. | |
| 2023/0275067 A1* | 8/2023 | Sharma | H01L 25/18 |
| | | | 257/714 |
| 2023/0317146 A1* | 10/2023 | Sharma | H10B 10/125 |
| | | | 257/369 |
| 2023/0380194 A1* | 11/2023 | Chang | H10B 63/10 |
| 2023/0385491 A1 | 11/2023 | Li | |
| 2023/0420371 A1* | 12/2023 | Radens | H10D 84/85 |
| 2024/0222271 A1 | 7/2024 | Sharma et al. | |

* cited by examiner 101
101

103  103  103A
103B

102

120

110

110

102

130

140

100

110

210

602

222

603

632

200A

655

200B

210

110

700

789

788

702

716

778
777
779
M12
753

752
M11

M10
754

M9

M8

M7

M6

M5

M4/V3

M3/V2

M2/V1

M1

V0

M0

C1

704

C0

222

713

210

750

712
711
714

744

BM0

BM1
751

705

754
BM2

MIM

753
BM3

755

706

Bump

555

1006

IC DIE WITH STACKED SRAM CELLS WITH SHARED WORDLINE CONNECTIONS
1050

BATTERY/ POWER SUPPLY
1015

INTEGRATED SYSTEM
1010

1020

PMIC ⟋1030

1035
CONTROLLER

1025
RFIC TX/RX

TO ANTENNA

TO MEMORY

MEMORY/ PROCESSOR
⟋1050

555

STACKED SRAM WITH SHARED WORDLINE CONNECTION

BACKGROUND

Memory performance and cost pressures drive a continuous and increasing demand for denser and cheaper static random-access memory (SRAM) devices. Such density improvements could readily impact larger and more complex devices. For example, processor performance can be improved by packing SRAM into smaller spaces or by packing more SRAM into the same space. More complex systems can be made better or less expensive with denser and cheaper SRAM.

Structures and methods are needed to improve SRAM devices and the larger systems they make up. It is with respect to these and other considerations that the present improvements have been needed. Such improvements may become critical as the desire to improve SRAM become even more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings.

DETAILED DESCRIPTION

Figures 1A, 1B:
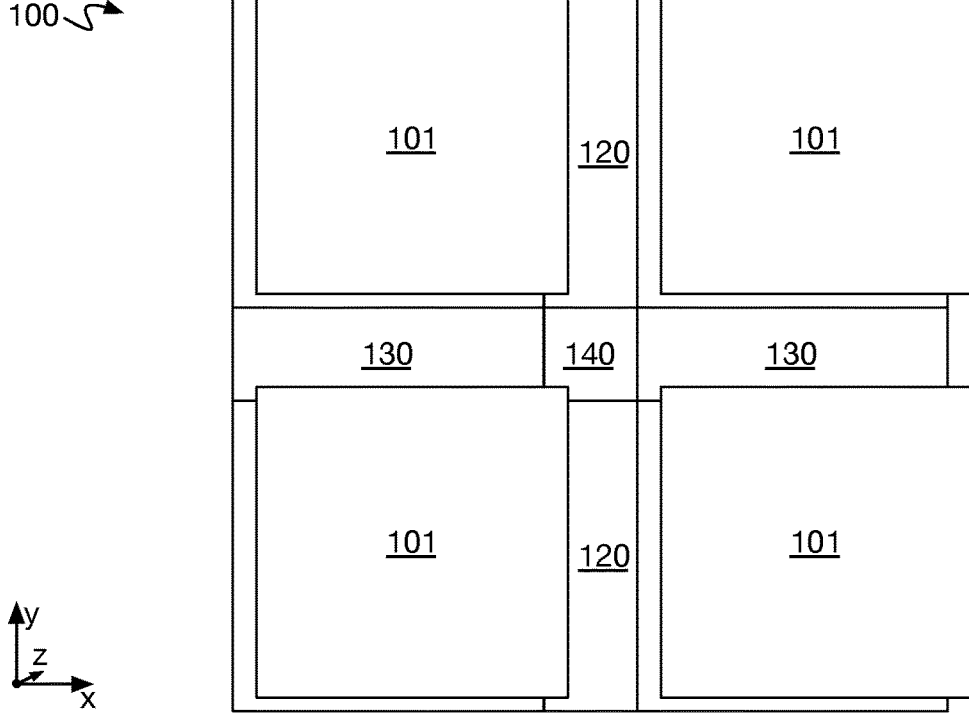
FIGS. 1A, 1B, and 1C illustrate block-diagram plan views of example integrated circuit (IC) dies, including static random-access memory (SRAM) circuitry.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure. The term "aligned" (i.e., vertically or laterally) indicates at least a portion of the components are aligned in the pertinent direction while "fully aligned" indicates an entirety of the components are aligned in the pertinent direction.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified, the use of the ordinal adjectives "first," "second," and "third," etc., to describe a common object, merely indicate that different instances of like objects to which are being referred and are not intended to imply that the objects so described must be in a given sequence, either temporally, spatially, in ranking, or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the density of static random-access memory (SRAM) cells. As used herein, the term SRAM cell indicates a circuitry module to store one bit. SRAM cells storing bits together in a word are connected by wordlines. By stacking SRAM cells and connecting horizontal wordlines vertically, the same memory can be stored in half the area, or the same area can store twice the memory. Less lateral area means that shorter wordlines can be used. Likewise, a wordline of the same horizontal length can connect twice as many SRAM cells, i.e., a stored word can have twice as many stored bits. Relatively shorter signal or data lines can enable quicker operation.

Figure 1C:
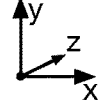

FIGS. 1A, 1B, and 1C illustrate block-diagram plan views of example integrated circuit (IC) dies 100, including SRAM circuitry 101, in accordance with some embodiments. In FIG. 1A, an IC die 100 has SRAM circuitry 101 along most of the perimeter of IC die 100, external to control circuitry 140, row decoders 120, and column decoders 130. In FIG. 1B, IC die 100 has twice the SRAM cells in stacked SRAM circuitry 101 and has similar control circuitry 140, row decoders 120, and column decoders 130. SRAM circuitry 101 is stacked, one above the other, with a shared row decoder 120 and shared column decoder 130. In FIG. 1C, example SRAM circuitries 101, one stacked over the other, are shown to each include an array of SRAM cells 110. Control circuitry 140 controls row decoders 120 and column decoders 130. Furthermore, control circuitry 140 controls SRAM circuitry 101 through row decoders 120 and column decoders 130. Rows of control and/or data lines extend in the x directions, both left and right, into SRAM circuitry 101 from row decoders 120. Columns of control and/or data lines extend in both y directions, into SRAM circuitry 101 from column decoders 130. SRAM circuitry 101 includes many SRAM cells 110, each storing at least one data bit.

Multiple bits can be referenced together as a group. This group of bits in memory is referred to as a "word," and all of the bits in the word can be referenced with a single memory address. A single word can contain, e.g., eight bits, or fewer or many more bits. For example, a single address can reference a word with 72 bits, each bit stored by a single SRAM cell. When an address is received by control circuitry 140 for reading from or writing to a word in memory, the address is decoded and a wordline is, e.g., energized to a high logic level to read from or write to the SRAM bits referenced by the address. Although descriptions of the examples here may use example voltage or logic levels, e.g., when discussing control signals or stored data bits, other embodiments may use opposite voltage or logic levels. For example, instead of using a high voltage level to turn on an NMOS transistor as in some embodiments, other embodiments may use a low voltage level to turn on a PMOS transistor. In some embodiments, a low logic level on a wordline accesses the bits in a word. In some embodiments, the address decoding occurs in row decoders 120 or column decoders 130. In some embodiments, at least some of the address decoding occurs in control circuitry 140. In some embodiments, at least some of the address decoding occurs in circuitry external to IC die 100.

In the example of FIG. 1C, control circuitry 140 partially decodes an address referencing a row of SRAM cells 110 and sends control signals to row decoder 120 and column decoder 130. Row decoder 120 further decodes the address and energizes a single wordline 102, which connects to a row of SRAM cells 110 in the lower SRAM circuitry 101 in the SRAM stack and another row of SRAM cells 110 in the upper SRAM circuitry 101. Every SRAM cell 110 in a word may be connected to a common wordline 102. In some embodiments, SRAM cells 110 in a word may be connected to multiple common wordlines 102, e.g., separate wordlines 102 for read and write operations.

Column decoder 130 also further decodes the address and prepares multiple bitlines 103 for either reading from or writing to the addressed word. For example, when reading the multiple bits in an addressed word, column decoder 130 may pre-charge bitlines 103 associated with the addressed bits to, e.g., an intermediate voltage level between the low and high logic levels. When writing to the bits in a word, column decoder 130 may set each bitline 103 independently to its own particular logic level, low or high, depending on the data to be written to that bit in the memory word. Each bitline 103 may be connected to multiple SRAM cells 110 in different words. Each SRAM cell 110 may be connected to multiple bitlines 103. In some embodiments, each SRAM cell 110 is connected to two complementary bitlines 103, one that matches the stored logic level of the bit and another that is the inverse of the stored bit. For example, bitlines 103A, 103B are connected to the same SRAM cells 110 and may be high and low (or low and high), respectively, depending on the data read from or written to the connected SRAM cell 110. The data read onto (or written from) bitlines 103 from (or to) SRAM cells 110 passes from the SRAM circuitry 101 out (or in) through column decoder 130 as indicated.

FIG. 1C shows a single wordline 102 for each row of SRAM cells 110 in lower SRAM circuitry 101. A same wordline 102 may control the row of SRAM cells 110 in upper SRAM circuitry 101 stacked above and vertically aligned with the associated row of SRAM cells 110 in lower SRAM circuitry 101. For example, a single, integrated wordline 102 may be in both vertically adjacent layers. The physical constructs associated with wordline 102 can be shared across the layers. Vertical connections, e.g., horizontally internal to each SRAM cell 110, can connect upper SRAM circuitry 101 to wordline 102 in the lower level. If desired, a duplicate wordline 102 can connect SRAM cells 110 in upper SRAM circuitry 101 to SRAM cells 110 in lower SRAM circuitry 101 by connecting to the shown wordline 102 in the lower level at, e.g., an edge of the SRAM circuitries 101 or at row decoder 120. Though not shown, each column of SRAM cells 110 in upper SRAM circuitry 101 is connected to column decoder 130 by another pair of bitlines 103 in a manner similar to that shown for lower SRAM circuitry 101.

To double the SRAM storage and double the word length, rather than extending SRAM circuitry 101 laterally, stacking the SRAM circuits allows twice as much data to be stored without increasing the length of wordlines 102 or bitlines 103. As shorter read or write times can be achieved by shorter signal or data line lengths, stacking SRAM cells 110 enables faster operation. A single, same-length wordline 102 can connect twice as many SRAM cells 110 with vertical connections at each pair of vertically aligned SRAM cells 110. Here and throughout, SRAM cells 110 are considered "vertically aligned" if the components of the cells are within horizontal boundaries that substantially overlap, i.e., as if looking down on a plan view of the cells. The horizontal boundary or boundaries of an SRAM cell 110 are defined widely enough to include at least its transistors, as described in the following figures below, but not so widely as to unnecessarily include the transistors of another SRAM cell 110 in the same layer. Portions of wordlines 102 and bitlines 103 may be external to the horizontal boundaries of SRAM cells 110, but wordlines 102 and bitlines 103 may have portions within the cells.

Figure 2:
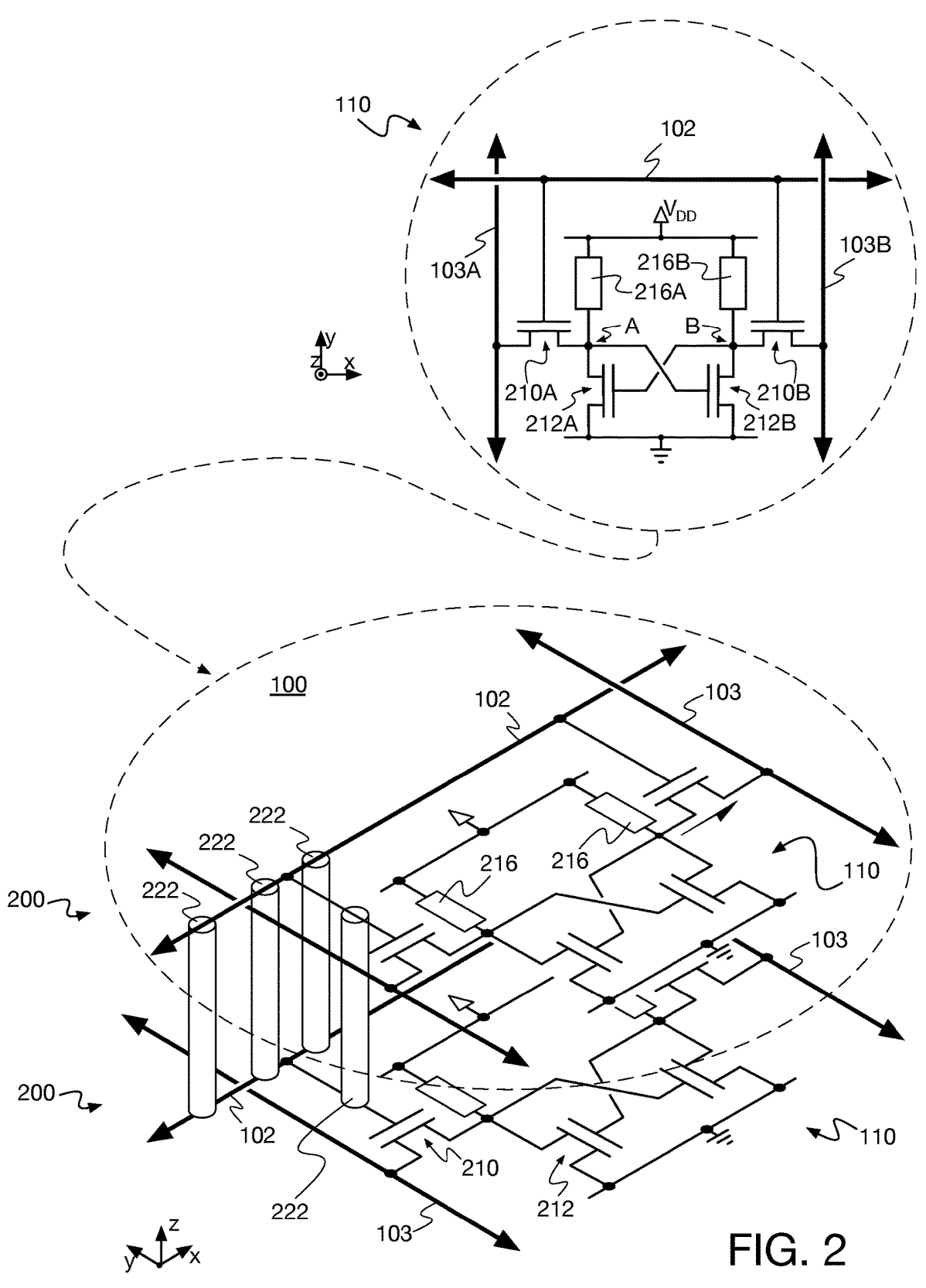
FIG. 2 illustrates plan and isometric schematic representations of an IC die, including stacked SRAM cells.

FIG. 2 illustrates plan and isometric schematic representations of IC die 100, including stacked SRAM cells 110, in accordance with some embodiments. As shown in FIG. 2, an example four-transistor (4T) SRAM cell 110 includes two pull-up resistors 216 (or load resistors) and four transistors: two access transistors 210 (or pass transistors) and two pull-down transistors 212 (or drive transistors). Wordline 102 connects to the gate electrodes of two access transistors 210, which when activated connect bitlines 103 to the storage nodes A, B of SRAM cell 110. SRAM cells 110 are stacked one above the other, vertically aligned in adjacent device layers 200, and share connected wordlines 102. Wordlines 102 are connected by metallization structures 222. Pull-up resistors 216 are connected to $V_{DD}$, and pull-down transistors 212 are connected to ground (or $V_{SS}$).

SRAM cell 110 is an example of a suitable structure for storing bits as part of a word. SRAM cell 110 has two stable states, each representing either a 1 or a 0 (corresponding to a high voltage level and a low voltage level respectively at, e.g., storage node A), which are reinforced by the cross-coupled inverters (including pull-down transistors 212 and pull-up resistors 216). SRAM cell 110 stores the logical 1 (or 0), e.g., at storage node A, and the inverse, logical 0 (or 1), e.g., at storage node B. For example, if a high voltage level (e.g., approximately $V_{DD}$) is at storage node A, that voltage is on the gate of pull-down transistor 212B, which pulls down the voltage at storage node B. The low voltage level (e.g., approximately ground (or $V_{SS}$)) at storage node B is on the gate of pull-down transistor 212A, which is therefore off and maintains the high voltage level at storage node A. Initial switching currents (when the inverters change state) charge parasitic capacitances at storage nodes A, B, but standby currents (after the inverters have settled into an equilibrium state) are lower. Most of $V_{DD}$ is across pull-up resistor 216B, while pull-up resistor 216A will have approximately zero voltage drop (corresponding only to the leakage currents, e.g., through off pull-down transistor 212A and the gate of pull-down transistor 212B). The inverters ensure that if one storage node is high, the other storage node is low, and vice versa.

Large-value load resistors can drop sufficient voltage with minimal standby current, while still providing satisfactory operation and maintaining sufficiently small cell size. Any suitable material and structure may be used for the pull-up resistors. In some embodiments, pull-up resistors 216 are polycrystalline silicon, which has an advantageously high sheet resistance.

As previously discussed, SRAM cells 110 are accessed in word groups by wordlines 102, which can be seen in FIG. 2 to control access transistors 210. Whether writing data from bitlines 103 to the storage nodes of SRAM cell 110 or reading data to bitlines 103 from the storage nodes of SRAM cell 110, data is transferred into or out of the cell by the conduction of access transistors 210. When the voltage on wordline 102 is high, access transistors 210A, 210B conduct, which electrically connects bitlines 103A, 103B to storage nodes A and B, respectively. Complementary bitlines and multiple access transistors 210 are not required. In some embodiments, a single access transistor 210 electrically connects a single bitline 103 to a storage node.

The length of a word can be, e.g., doubled without a corresponding increase in length of wordline 102 by stacking SRAM cells 110 in two device layers 200. Device layers are horizontal layers that include transistors and are vertically separate from each other. SRAM cells 110 in a same word are shown stacked one above the other. Their two wordlines 102 are parallel in vertically adjacent device layers 200 and connected at multiple points by vertical metallization structures 222, which electrically connect the gate electrodes of access transistors 210 in vertically aligned SRAM cells 110. One, some, or all of the metallization structures 222 shown and/or other metallization structures 222 may be used to electrically connect access transistor 210 gate electrodes. In some embodiments, a single metallization structure 222 connects wordlines 102 in vertically adjacent device layers 200. Such a connection maintains minimal manufacturing complexity and costs by duplicating layouts for SRAM cells 110 and SRAM circuitry 101. Such a connection can be made in any of a number of suitable locations. In some embodiments, a vertical metallization structure 222 external to the perimeter or horizontal boundary of SRAM cell 110 at an edge of SRAM circuitry 101 electrically connects the gate electrodes of upper and lower access transistors 210 in vertically aligned SRAM cells 110. In some such embodiments, this vertical metallization structure 222 is at the root of a wordline 102 from row decoder 120.

Both a minimal-length wordline 102 and minimally complex design can be maintained with multiple electrical connections along wordline 102. Metallization structures 222 can connect duplicate wordlines 102 in vertically adjacent device layers 200, e.g., at each SRAM cell 110. With electrically parallel wordlines 102, resistance and resulting switching delays can be minimized. In some embodiments, a vertical metallization structure 222 directly contacts and electrically connects the gate electrodes of upper and lower access transistors 210 in vertically aligned SRAM cells 110. In some such embodiments, every access transistor 210 gate electrode in a word is electrically connected to every other gate electrode by a single wordline 102 in, e.g., lower device layer 200 and a vertical metallization structure 222 at every access transistor 210 directly contacting gate electrodes of upper and lower access transistors 210 in vertically aligned SRAM cells 110. In other embodiments, much of wordlines 102, e.g., those portions laterally external to vertically aligned SRAM cells 110, may be characterized as vertical metallization structure 222 with the physical constructs associated with wordline 102 shared across vertically adjacent device layers 200. For example, a single, integrated wordline 102 may be in both vertically adjacent device layers 200. Rather than, e.g., discrete horizontal metallization lines in both vertically adjacent device layers 200 connected by discrete vertical metallization structures 222, wordline 102 may be analogous to a metallization wall, having a same footprint as the metallization lines but vertically integrated into a taller structure spanning the entirety of both vertically adjacent device layers 200. In other embodiments, the single, integrated wordline 102 shared across both vertically adjacent device layers 200 is analogous to a metallization wall, but wordline 102 occupies only an upper portion of the lower device layer 200 and a lower portion of the upper device layer 200.

Metallization structure 222 can be any suitable structure. In some embodiments, metallization structure 222 is at an edge of device layer 200, external to the horizontal boundaries of all SRAM cells 110 in the layer, and includes a large via connecting vertically adjacent metallization layers (e.g., BM0 and Met0, or Met0 and Met1). Connections can also be made at the device level. In some embodiments, metallization structure 222 is a substantially vertical part of a common wordline 102, horizontally within the boundaries of two vertically aligned SRAM cells 110, one below the other, and directly contacts the gate electrodes of access transistors 210.

Access transistors 210 and pull-down transistors 212 may be of any suitable transistor type or material. Advantageously, the transistors will have fast switching times and low leakage currents. In some embodiments, all four transistors are field-effect transistors (FETs), such as metal-oxide-semiconductor (MOS) FETs. Also advantageously, for ease of manufacturing and reduced cost and cell size, a same transistor type (e.g., n- or p-type) will be used for all of access transistors 210 and pull-down transistors 212. For example, in some embodiments, the four transistors in both stacked SRAM cells 110 (so eight total) are all n-type MOS (NMOS) transistors. Access transistors 210 and pull-down transistors 212 need not be of the same type, and access transistors 210 can be of different types. In some embodiments, at least one of access transistors 210 in both vertically aligned SRAM cells 110 is a non-planar FET, e.g., a FinFET with a channel having one or more fin structures between source and drain and controlled by a gate electrode. In some embodiments, at least one of access transistors 210 in both vertically aligned SRAM cells 110 is a non-planar FET with a channel having one or more nanowires or nanosheets between source and drain and controlled by a gate electrode.

Figure 3:
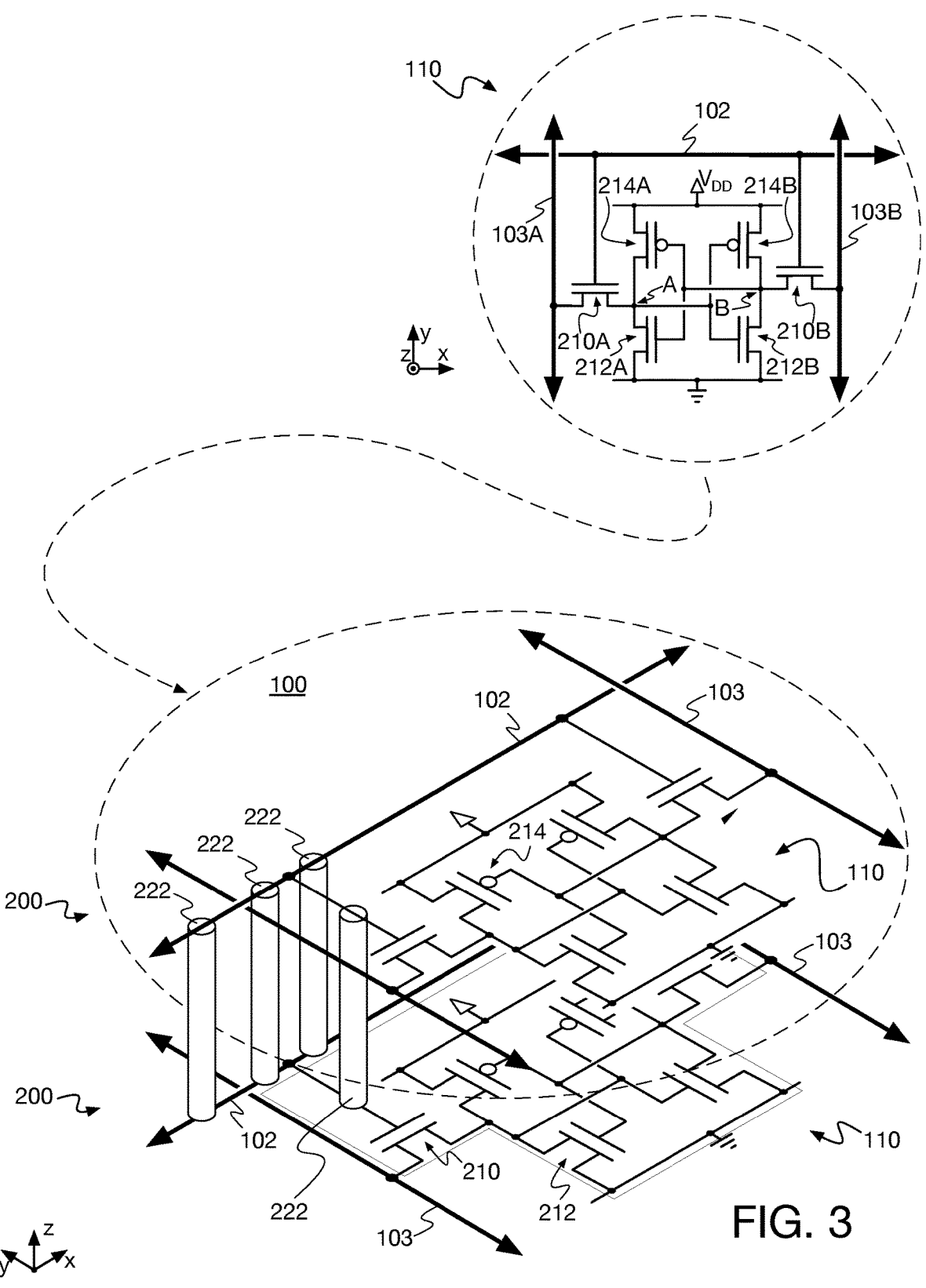
FIG. 3 illustrates plan and isometric schematic representations of an IC die, including stacked SRAM cells.

FIG. 3 illustrates plan and isometric schematic representations of IC die 100, including stacked SRAM cells 110, in accordance with some embodiments. As shown in FIG. 3, the example six-transistor (6T) SRAM cell 110 includes cross-coupled inverters similar to those of FIG. 2 (with access transistors 210 and pull-down transistors 212), but with two pull-up transistors 214 (or load transistors, instead of load or pull-up resistors). Pull-up transistors 214 are connected to $V_{DD}$, and pull-down transistors 212 are connected to ground (or $V_{SS}$). As before, wordline 102 controls access transistors 210, which in turn control the connection of bitlines 103 to storage nodes A, B. SRAM cells 110 and shared wordlines 102 are stacked in vertically adjacent device layers 200 and connected by one or more metallization structures 222.

The complementary metal-oxide-semiconductor (CMOS) (or other complementary-type) inverters in FIG. 3 work similarly to the inverters in FIG. 2, but enable smaller leakage and standby currents. When pull-down transistor 212A (or 212B) is on, instead of drawing a current through a load resistor, pull-up transistor 214A (or 214B) is off. The complementary-type transistors need not be planar or MOS-FETs. In some embodiments, all access transistors 210 and pull-down transistors 212 are n-type FinFETs and pull-up transistors 214 are p-type FinFETs in both vertically aligned SRAM cells 110. In other embodiments, all access transistors 210 and pull-down transistors 212 are n-type FETs and pull-up transistors 214 are p-type FETs in both vertically aligned SRAM cells 110, and their channels include nanowires or nanosheets instead of fins.

Complementary-type inverters (instead of inverters with pull-up resistors) can achieve lower power consumption with a tradeoff of additional cell size. In some embodiments, thin-film transistors (TFTs) can be used as pull-up transistors 214 to provide sufficiently large load resistance but with reduced cell size. For example, in some embodiments, all access transistors 210 and pull-down transistors 212 are n-type FETs and pull-up transistors 214 are TFTs, which do not require the additional space of an added p-type well. TFTs can be used in other ways as well. In some stacked SRAM cells 110, all transistors are TFTs. In other embodiments, a lower SRAM cell 110 does not use TFTs, and an upper SRAM cell 110 uses TFTs only.

Figure 4:
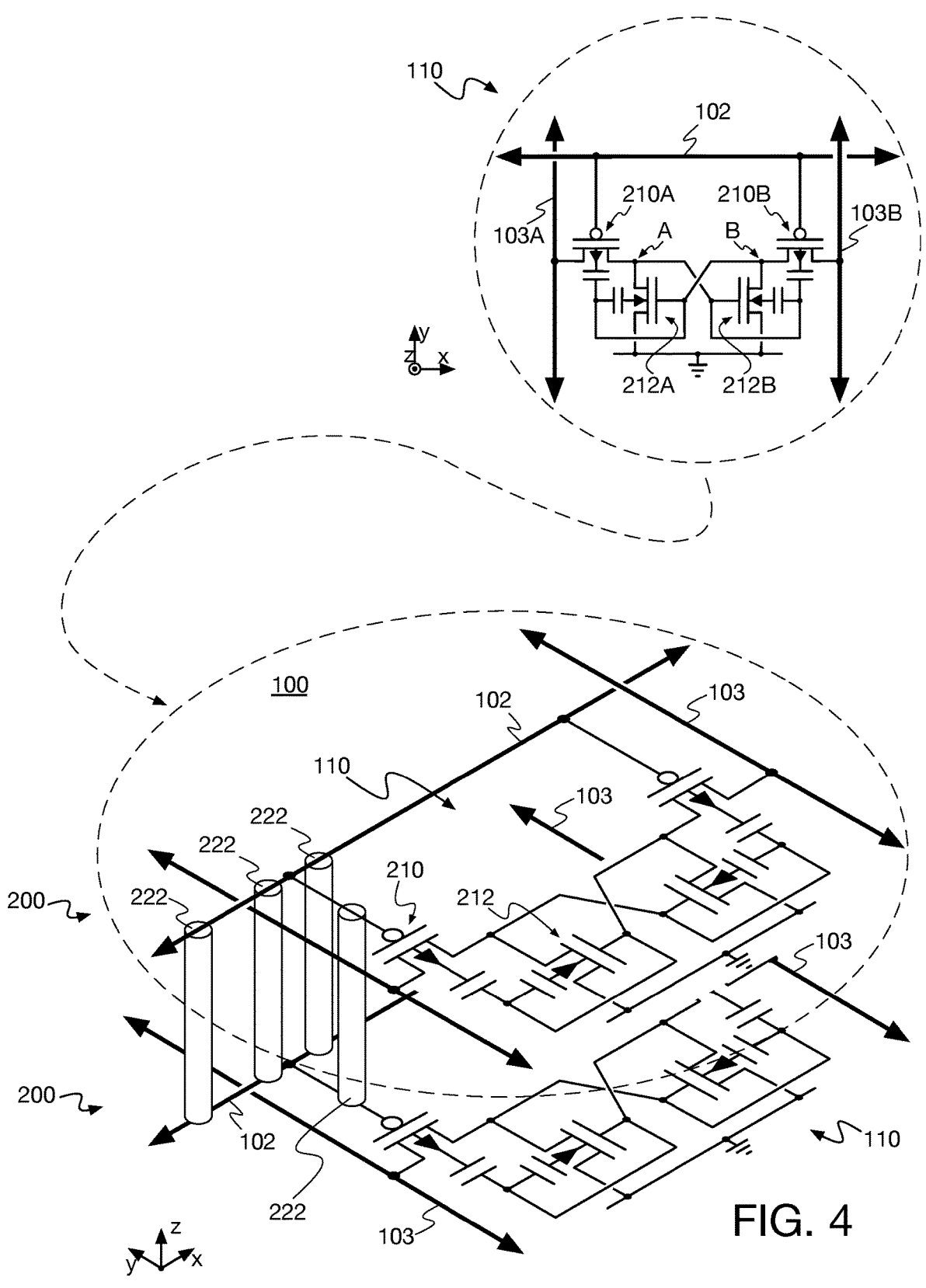
FIG. 4 illustrates plan and isometric schematic representations of an IC die, including stacked SRAM cells.

FIG. 4 illustrates plan and isometric schematic representations of IC die 100, including stacked SRAM cells 110, in accordance with some embodiments. As shown in FIG. 4, an example 4T SRAM cell 110 includes two access transistors 210 and two pull-down transistors 212 (or drive transistors), but no load resistors or transistors between storage nodes A, B and $V_{DD}$. Storage nodes A, B connect to bitlines 103 through access transistors 210 when a low voltage level on wordline 102 and the gate electrodes of access transistors 210. Vertical metallization structures 222 connect stacked SRAM cells 110 and wordlines 102 in vertically adjacent device layers 200.

The example 4T SRAM cell 110 of FIG. 4 operates similarly to previously described SRAM cells 110, but without pull-up resistors or transistors to pull up the voltage on storage node A or B to $V_{DD}$. Without a pull-up resistor or transistor, a high storage-node voltage is maintained by leakage current through one of access transistors 210 exceeding leakage current through a pull-down transistor 212. Different transistor types and sizes may be used to properly size leakage currents. In some embodiments, access transistors 210 are p-type FETs and pull-down transistors 212 are n-type FETs of similar or smaller width. In some embodiments, pull-down transistors 212 are n-type FETs, and access transistors 210 are similar but wider n-type FETs. In some embodiments, pull-down transistors 212 are n-type FETs, and access transistors 210 are n-type FETs with lower threshold voltages.

Other suitable SRAM cells may be used as well, including cells using eight transistors, 12 transistors, etc.

Figure 5A:
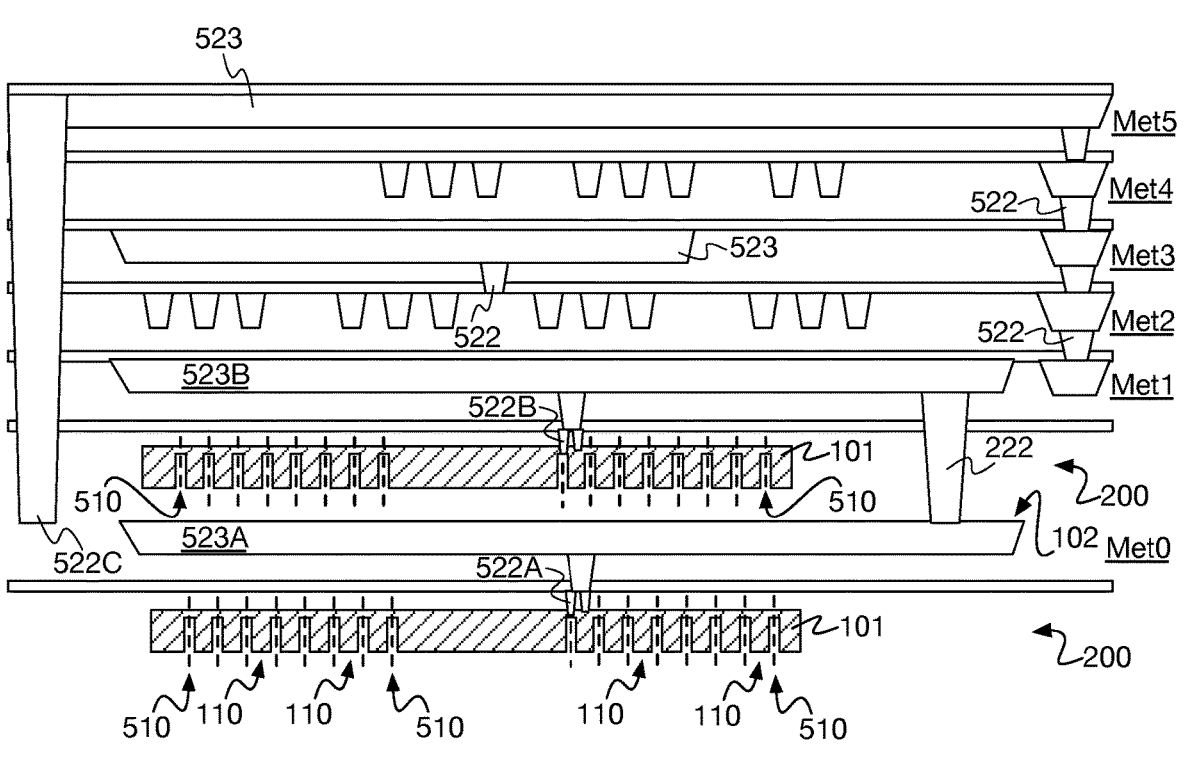
FIGS. 5A, 5B, and 5C illustrate cross-sectional profile and plan views of an IC die, including stacked SRAM circuitry with SRAM cells.
Figure 5A:
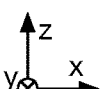
Figures 5B, 5C:
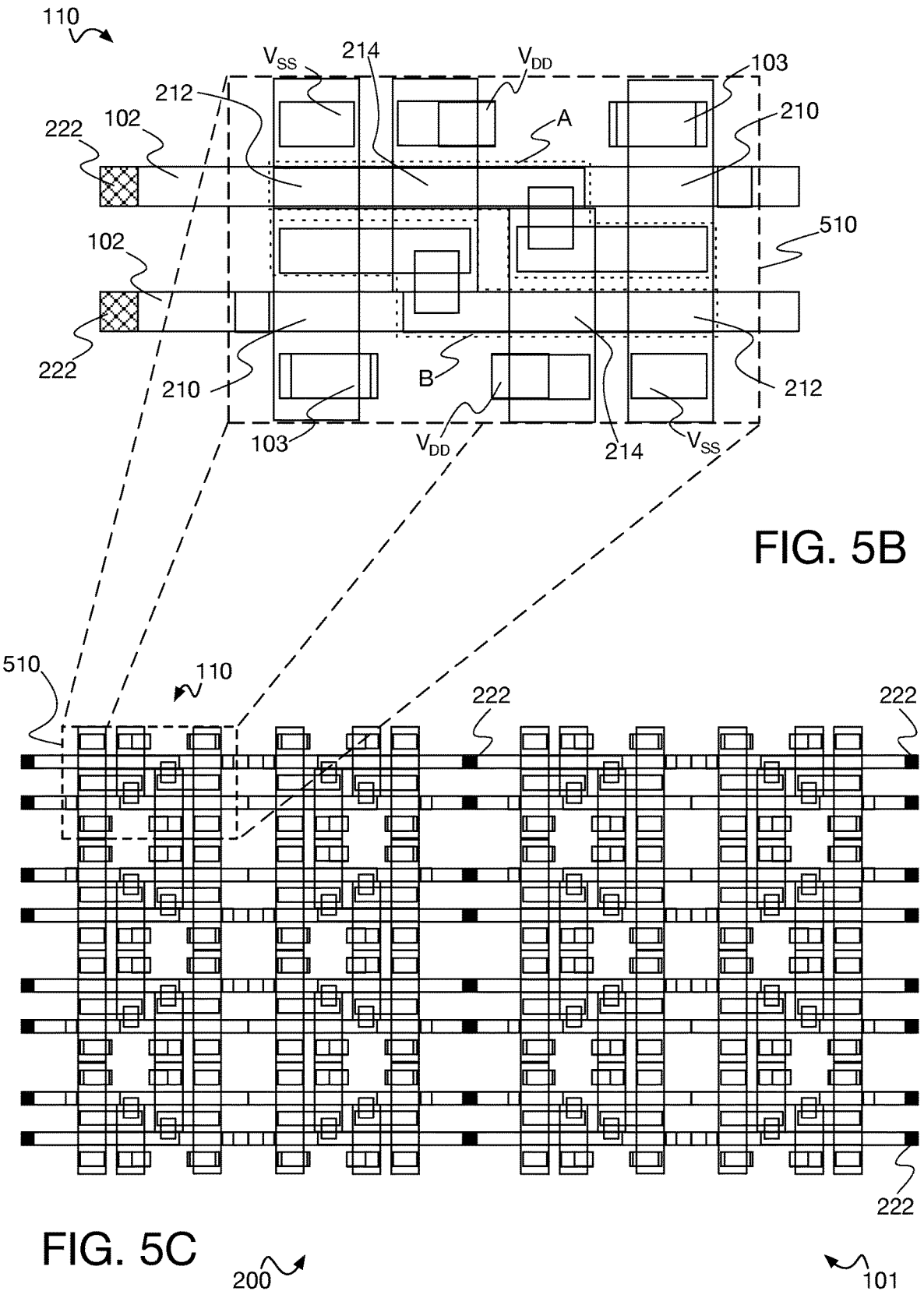

FIGS. 5A, 5B, and 5C illustrate plan and cross-sectional profile views of IC die 100, including stacked SRAM circuitry 101 with SRAM cells 110, in accordance with some embodiments. As shown in the cross-sectional profile view of FIG. 5A, upper and lower SRAM circuitry 101 are in vertically stacked device layers 200 in IC die 100. Metallized vias 522 vertically connect structures, e.g., horizontal metallization portions 523 in vertically adjacent metallization layers. Both upper and lower SRAM circuitry 101 include many SRAM cells 110, including multiple SRAM cells 110 within a same word, i.e., referenced and connected by a common wordline 102. Wordline 102 includes horizontal metallization portions 523A, 523B in vertically adjacent metallization layers Met0 and Met1, respectively. Local vias 522A, 522B or jumpers connect to SRAM cells 110 in lower and upper SRAM circuitry 101, respectively, and are also part of wordline 102. Wordline 102 also includes metallization structure 222, a vertical via connection between Met0 and Met1 that is external to the horizontal boundaries 510 (indicated by dashed, vertical lines) of individual SRAM cells 110.

IC die 100 is attached to a substrate 555 and coupled to a power supply through substrate 555. Deep border via 522C and other vias extend through and interconnect multiple metallization layers. Some vias extend to a bottom side of IC die 100, where interface interconnects (such as bond pads, etc.) in IC die 100 and substrate 555 mechanically and electrically connect. Substrate 555 may be any suitable host component. In some embodiments, substrate 555 is a package substrate or interposer. In some embodiments, substrate 555 is another IC die.

FIG. 5B shows a plan view of an example layout of an SRAM cell 110. An example horizontal boundary 510 or perimeter of SRAM cell 110 is represented as a dashed box. Various structures in one layer overlap other structures in another layer. Cross-sectional areas of structures extending from one layer into or through one or more other layers are seen in this plan view. For example, only cross-sectional areas of vertical metallization structures 222 are seen as they extend vertically to connect a wordline 102 in one device layer to a wordline 102 in a device layer stacked vertically above the first device layer. In this example, at least two metal structures collectively perform the functions of wordline 102, e.g., for reading and writing operations. Storage nodes A, B are represented as dotted polygons at the overlap and connection of various structures. Wordlines 102 connect to the gate electrodes of access transistors 210, which connect bitlines 103 to storage nodes A, B. Storage nodes A, B electrically connect the channels of one set of a pull-down transistor 212 and pull-up transistor 214 to an access transistor 210 and the gates of another set of a pull-down transistor 212 and pull-up transistor 214. Pull-up transistors 214 each connect to one storage node and to $V_{DD}$ at either end of their channels, and have the other storage node connected to their gates. Pull-down transistors 212 each connect to one storage node and to $V_{SS}$ (e.g., ground) at either end of their channels, and have the other storage node connected to their gates.

FIG. 5C shows a plan view of a portion of SRAM circuitry 101 in a single device layer 200, including multiple SRAM cells 110. An example horizontal boundary 510 or perimeter of SRAM cell 110 is represented as a dashed box and helps illustrate the relationship between a single SRAM cell 110 and SRAM circuitry 101, which includes multiple SRAM cells 110. Vertical metallization structures 222 (shown crosshatched in FIG. 5B and as black in FIG. 5C) connect wordline 102 in device layer 200 to wordline 102 in a vertically stacked, second device layer. In some embodiments, vertical metallization structures 222 make a connection only once per wordline 102, e.g., at an edge of SRAM circuitry 101. In some embodiments, vertical metallization structures 222 make multiple connections per SRAM cell 110, e.g., at gate electrodes of access transistors 210.

Figure 6A:
FIGS. 6A, 6B, 6C, and 6D illustrate cross-sectional profile and isometric views of an IC die, including shared wordline connections between access transistors in stacked SRAM cells.

FIGS. 6A, 6B, 6C, and 6D illustrate cross-sectional profile and isometric views of IC die 100, including shared wordline 102 between access transistors 210 in stacked SRAM cells 110, in accordance with some embodiments. FIG. 6A shows a cross-sectional profile view of IC die 100 with access transistors 210 in stacked SRAM cells 110. The vertically aligned SRAM cells 110 are in vertically stacked device layers 200A, 200B. The upper access transistor 210 is in upper SRAM cell 110, and lower access transistor 210 is in lower SRAM cell 110. Vertical metallization structure 222 is internal to both SRAM cells 110 and is part of a common wordline 102. Vertical metallization structure 222 directly contacts and electrically connects gate electrodes 602 of access transistors 210.

The channels 603 of access transistors 210 are within nanosheets or nanoribbons, but could be in fins, nanowires, etc., and access transistors 210 need not be non-planar transistors or even FETs. Access transistors 210 can be of either doping type. In some embodiments, access transistors 210 are NMOS transistors. In some embodiments, access transistors 210 are PMOS transistors. The channel source and drain connections (not shown) of access transistors 210 connect to bitlines and storage nodes.

In the example of FIG. 6A, device layer 200A is on a front side of substrate 655, and device layer 200B is on a back side of substrate 655. In some embodiments, vertical metallization structure 222 is BM0, the lowest-level back-side metallization layer, which is vertically adjacent to the lowest-level front-side metallization layer. Substrate 655 may be an etch stop layer. In some embodiments, device layers 200A, 200B are vertically adjacent and both on a front side (or back side).

High-k gate dielectrics 632 insulate channels 603 from gate electrodes 602. Gate dielectrics 632 may have more than one layer. The high-k dielectric material may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Other dielectric material may be used, such as silicon oxide or silicon dioxide ($SiO_2$). Again, other transistors, including non-MOS transistors, may be used, including transistors without gate dielectrics 632.

Figure 6B:
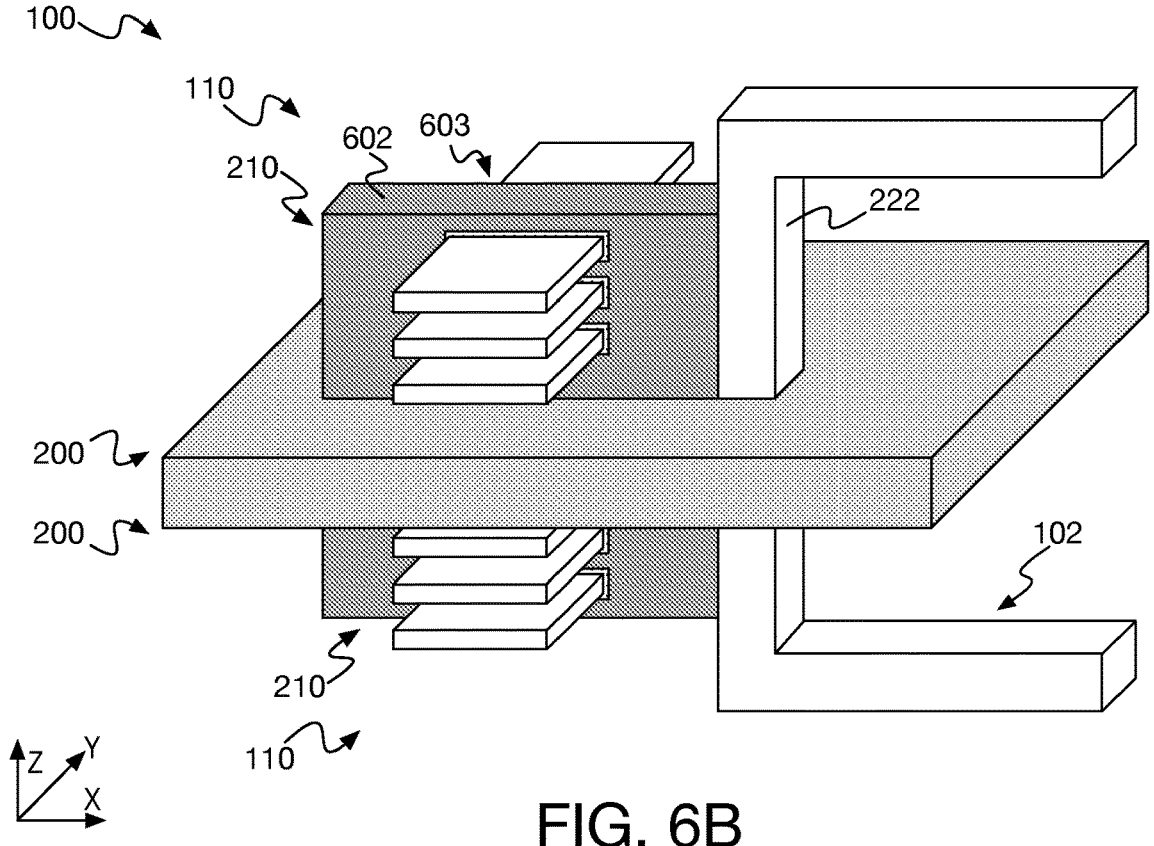

FIG. 6B shows an isometric view of similar structures in IC die 100, including vertical metallization structure 222 as part of common wordline 102 connecting gate electrodes 602 of access transistors 210 in stacked SRAM cells 110. SRAM cells 110 are vertically aligned and in vertically stacked device layers 200. Vertical metallization structure 222 is in both SRAM cells 110 and directly contacts gate electrodes 602. Channels 603 (obscured by gate electrodes 602) of non-planar access transistors 210 are within nanosheets or nanoribbons. In some embodiments, nanosheets in access transistors 210 and their channels 603 are 2 nm thick. In some embodiments, channels 603 are less than 1 nm thick.

Figure 6C:
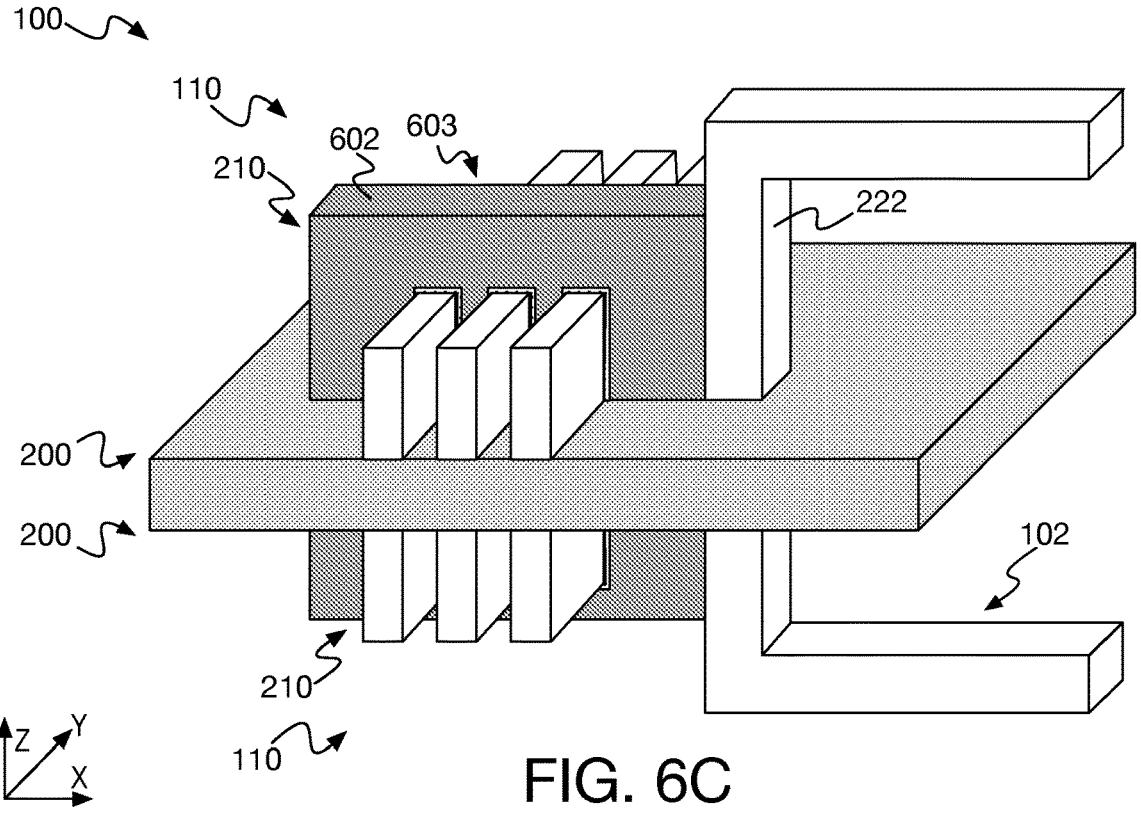

FIG. 6C shows an isometric view of similar structures in IC die 100, including vertical metallization structure 222 as part of common wordline 102 connecting gate electrodes 602 of FinFET access transistors 210 in vertically aligned SRAM cells 110 in vertically stacked device layers 200. Vertical metallization structure 222 directly contacts gate electrodes 602 and is in both SRAM cells 110. Channels 603 (obscured by gate electrodes 602) of non-planar access transistors 210 are within fin structures. In some embodiments, fins in access transistors 210 and their channels 603 are 2 nm thick. In some embodiments, channels 603 are 1 nm thick.

Figure 6D:
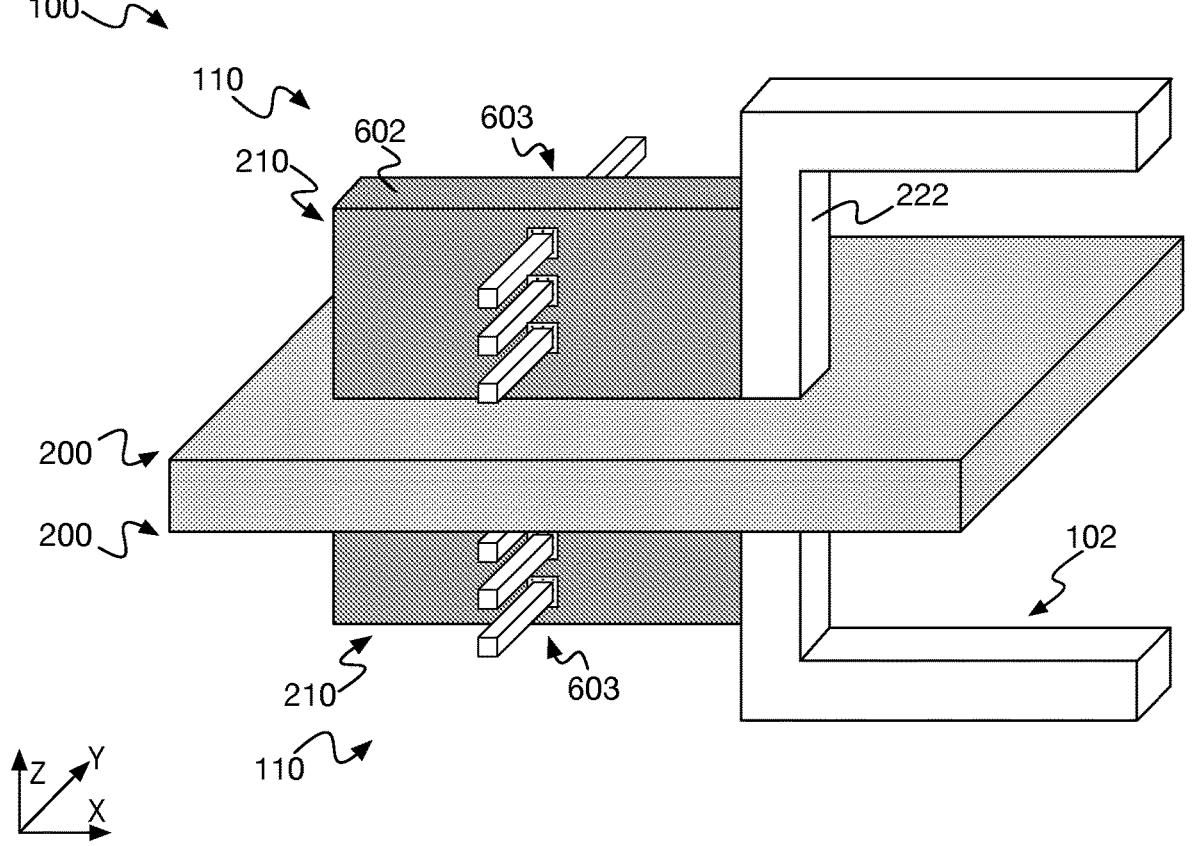

FIG. 6D shows an isometric view of similar structures in IC die 100, including vertical metallization structure 222 as part of common wordline 102 connecting gate electrodes 602 of nanowire access transistors 210 in vertically aligned SRAM cells 110 in vertically stacked device layers 200. Vertical metallization structure 222 directly contacts gate electrodes 602 and is in both SRAM cells 110. Channels 603 (obscured by gate electrodes 602) of non-planar access transistors 210 are within nanowires. In some embodiments, nanowires in access transistors 210 and their channels 603 are 2 nm thick. In some embodiments, channels 603 are less than 1 nm thick.

Other embodiments have other suitable channel structures.

Stacked SRAM cells with shared wordline connections may be integrated into a low-temperature system. Lower temperatures enhance conduction in many materials and can enable the use of, e.g., different materials and structures (such as smaller transistor channels). A number of structures may be used to lower the system temperature and so allow for the use of, e.g., smaller conducting structures. Active cooling structures can be used to lower system temperatures to below ambient temperature, even to well below ambient temperature. Active cooling structures can include thermo-electric coolers. In some embodiments, active cooling structures include stacks of alternating p- and n-type semiconductor materials. In some embodiments, active cooling structures flow cooling fluids through channels, including microchannels, thermally coupled to IC packages. In some embodiments, active cooling structures include channels thermally coupled to IC dies 100. In some embodiments, active cooling structures include channels on one or more sides of IC dies 100. In some embodiments, active cooling structures include channels within IC dies 100. In some embodiments, active cooling structures include two-phase cooling. In some embodiments, active cooling structures include low-boiling-point fluids. In some embodiments, active cooling structures include refrigerants as cooling fluids. In some embodiments, active cooling structures lower system temperatures to below 0° C.

Figure 7:
FIG. 7 illustrates a cross-sectional view of a low-temperature, stacked-SRAM IC system using die- and package-level active cooling.

FIG. 7 illustrates a cross-sectional view of a low-temperature, stacked-SRAM IC system 700 using die- and package-level active cooling, in accordance with some embodiments. In the example of IC system 700, IC die 702 includes active-cooling structures or components as provided by both die-level microchannels 777 and package-level active-cooling structure 788. IC system 700 includes a lateral surface along the x-y plane that may be defined or taken at any vertical position of IC system 700. The lateral surface of the x-y plane is orthogonal to a vertical or build-up dimension as defined by the z-axis. In some embodiments, IC system 700 may be formed from any substrate material suitable for the fabrication of transistor circuitry. In some embodiments, a semiconductor substrate is used to manufacture access transistors 210 and other transistors and components of IC system 700. The semiconductor substrate may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 7, IC system 700 includes an IC die 702, which is a monolithic IC with vertically stacked SRAM cells as described above, including access transistors 210, front-side metallization layers 704 (or front-side interconnect layers), and optional back-side metallization layers 705 (or back-side interconnect layers). As shown, access transistors 210 are non-planar transistors embedded within a dielectric layer 750. As shown, each of access transistors 210 include channel regions 711 (within nanoribbons or nanosheets), gate structures 712, and gate contacts 713. Each of access transistors 210 also include source and drain structures, and source and drain contacts, which are not shown in the cross-section of FIG. 7. In some embodiments, front-side metallization layers 704 (including vertical metallization structures 222) provide signal routing to access transistors 210 and back-side metallization layers 705 provide power delivery, as enabled by through-contacts 714, to access transistors 210. In some embodiments, IC system 700 further includes a package-level cooling structure 788, which may be deployed on or over front-side metallization layers 704 (as shown) or on or over a back-side of IC die 702. In some embodiments, package-level cooling structure 788 is coupled to IC die 702 by an adhesion layer 716. IC system 700 may also be deployed without back-side metallization layers 705 shown in FIG. 7. In such embodiments, signal routing and power are provided to access transistors 210 via front-side metallization layers 704. However, use of back-side metallization layers 705 may offer advantages.

Access transistors 210 are connected and thermally coupled by metallization, e.g., metal heat spreader 744, to the entire metallization structure by through-contacts 714. In this way, access transistors 210 are thermally coupled to both the die-level active-cooling structures (of die-level microchannels 777) and package-level active-cooling structure 788.

Interconnectivity of access transistors 210 (and other transistors, etc.), signal routing to and from SRAM circuitry, etc., power delivery to SRAM circuitry, etc., and routing to an outside device (not shown), is provided by front-side metallization layers 704, optional back-side metallization layers 705, and package-level interconnects 706. In the example of FIG. 7, package-level interconnects 706 are provided on or over a back-side of IC die 702 as bumps over a passivation layer 755, and IC system 700 is attached to substrate 555 (and coupled to signal routing to, power delivery, etc.) by package-level interconnects 706. However, package-level interconnects 706 may be provided using any suitable interconnect structures such as bond pads, solder bumps, etc. Furthermore, in some embodiments, package-level interconnects 706 are provided on or over a front-side of IC die 702 (i.e., over front-side metallization layers 704) and package-level cooling structure 788 is provided on or over a back-side of IC die 702 (i.e., adjacent access transistors 210).

In IC system 700, IC die 702 includes die-level, active-cooling as provided by die-level microchannels 777. Die-level microchannels 777 are to convey a heat transfer fluid therein to remove heat from IC die 702. The heat transfer fluid may be any suitable liquid or gas. In some embodiments, the heat transfer fluid is liquid nitrogen operable to lower the temperature of IC die 702 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 777 may be provided in any pattern in the x-y plane such as serpentine patterns, patterns of multiple parallel die-level microchannels 777, or the like. Die-level microchannels 777 couple to a heat exchanger (not shown) that removes heat from and cools the heat transfer fluid before re-introduction to die-level microchannels 777. The flow of fluid within die-level microchannels 777 may be provided by a pump or other fluid flow device. The operation of the heat exchanger, pump, etc. may be controlled by a controller.

In the illustrated embodiment, die-level microchannels 777 are implemented at metallization level M12. In other embodiments, die-level microchannels 777 are implemented over metallization level M12. Die-level microchannels 777 may be formed using any suitable technique or techniques such as patterning and etch techniques to form the void structures of die-level microchannels 777 and passivation or deposition techniques to form a cover structure 778 to enclose the void structures. As shown, in some embodiments, the die-level, active-cooling structure of IC system 700 includes a number of die-level microchannels 777 in IC die 702 and over a number of front-side metallization layers 704. As discussed, die-level microchannels 777 are to convey a heat transfer fluid therein. In some embodiments, a metallization feature 779 of metallization layer M12 is laterally adjacent to die-level microchannels 777. For example, metallization feature 779 may couple to a package-level interconnect structure (not shown) for signal routing for IC die 702. In some embodiments, a passive heat removal device such as a heat sink or the like may be used instead of or in addition to package-level cooling structure 788. In some embodiments, package-level cooling structure 788 is not deployed in IC system 700.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 751, are interconnected by vias, such as vias 752, that may be characterized as part of the metallization layers or between the metallization layers. As shown, in some embodiments, front-side metallization layers 704 are formed over and immediately adjacent access transistors 210. The back-side is then the opposite side, which may be exposed during processing by attaching the front-side to a carrier wafer and exposing the back-side (e.g., by back-side grind or etch operations) as known in the art.

In the illustrated example, front-side metallization layers 704 include M0, V0, M1, M2/V1, M3/V2, M4/V3, and M4-M12. However, front-side metallization layers 704 may include any number of metallization layers such as eight or more metallization layers. Similarly, back-side metallization layers 705 include BM0, BM1, BM2, and BM3. However, back-side metallization layers 705 may include any number of metallization layers such as two to five metallization layers. Front-side metallization layers 704 and back-side metallization layers 705 are embedded within dielectric materials 753, 754. Furthermore, optional metal-insulator-metal (MIM) devices such as diode devices may be provided within back-side metallization layers 705. Other devices such as capacitive memory devices may be provided within front-side metallization layers 704 and/or back-side metallization layers 705.

IC system 700 includes package-level active-cooling structure 788 having package-level microchannels 789. Package-level microchannels 789 are to convey a heat transfer fluid therein to remove heat from IC die 702. The heat transfer fluid may be any suitable liquid or gas as discussed with respect to die-level microchannels 777. Package-level microchannels 789 may be provided in any pattern in the x-y plane such as serpentine patterns, patterns of multiple parallel package-level microchannels 789, etc. Package-level microchannels 789 couple to a heat exchanger (not shown) that removes heat from and cools the heat transfer fluid before re-introduction to package-level microchannels 789. The flow of fluid within package-level microchannels 789 may be provided by a pump or other fluid-flow device. The operation of the heat exchanger, pump, etc. may be controlled by a controller. In the illustrated embodiment, package-level active-cooling structure 788 is a chiller mounted to IC die 702 such that the chiller has a solid body having microchannels therein to convey a heat transfer fluid.

In some embodiments, the heat-removal fluid deployed in die-level microchannels 777 and package-level active-cooling structure 788 are coupled to the same pump and heat exchanger systems. In such embodiments, the heat removal fluid conveyed in both die-level microchannels 777 and package-level active-cooling structure 788 are the same material. Such embodiments may advantageously provide simplicity. In other embodiments, the heat removal fluids are controlled separately. In such embodiments, the heat removal fluids conveyed by die-level microchannels 777 and package-level active-cooling structure 788 may be the same or they may be different. Such embodiments may advantageously provide improved flexibility.

As discussed, IC system 700 includes IC die 702 and optional die-level and package-level active-cooling structures operable to remove heat from IC die 702 to achieve a very low operating temperature of IC die 702. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active-cooling structure may be provided as a package-level structure (i.e., separable from IC die 702), as a die-level structure (i.e., integral to IC die 702), or both. In some embodiments, IC die 702 is deployed in a cold environment, formed using sufficiently conductive materials, etc. and an active-cooling structure is not used.

Figure 8:
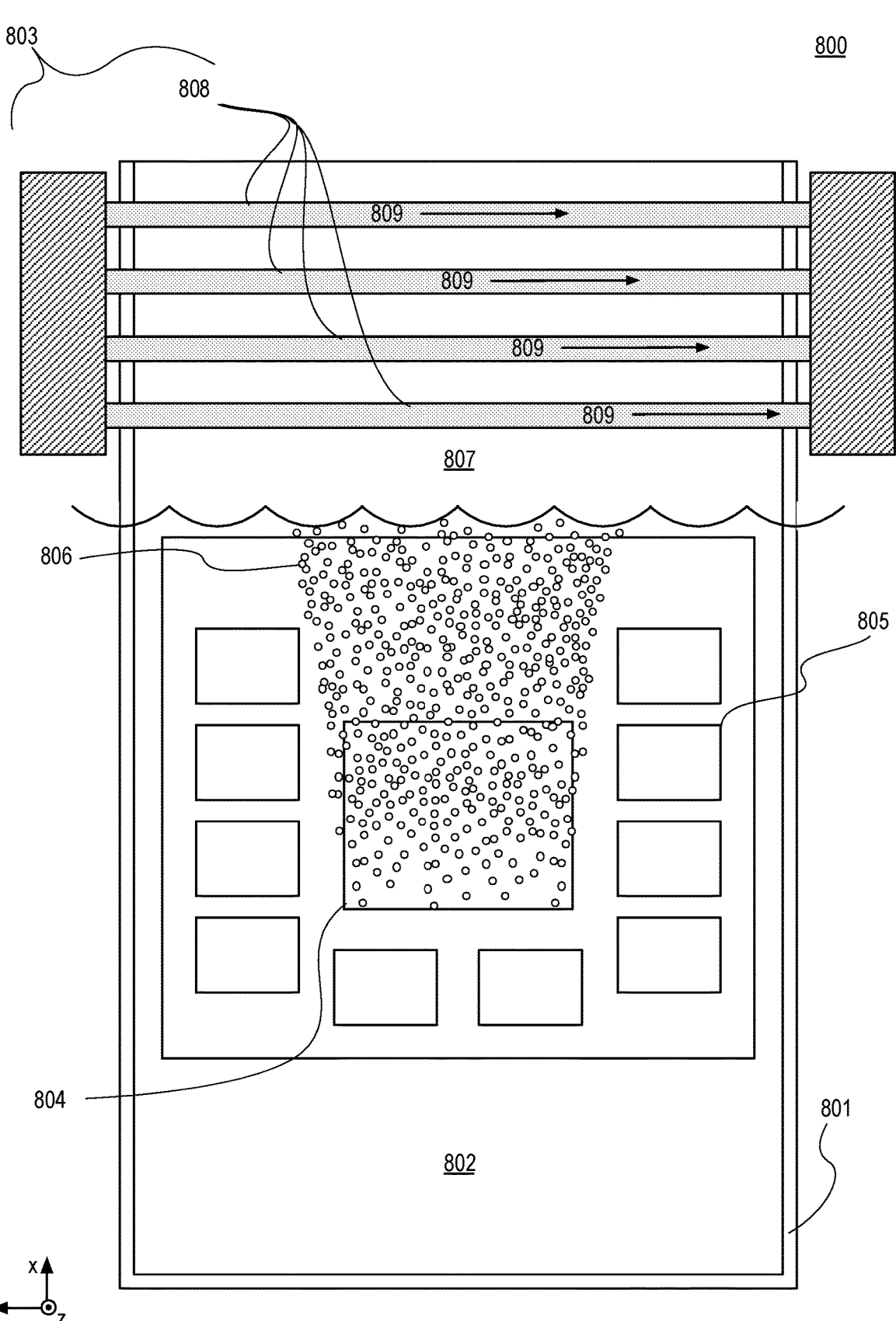
FIG. 8 illustrates a view of an example two-phase immersion cooling system for low-temperature operation of an IC die.

FIG. 8 illustrates a view of an example two-phase immersion cooling system 800 for low-temperature operation of an IC die, in accordance with some embodiments. As shown, two-phase immersion cooling system 800 includes a fluid containment structure 801, a low-boiling point liquid 802 within fluid containment structure 801, and a condensation structure 803 at least partially within fluid containment structure 801. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 804, such as an IC package including any of IC dies or systems 100, 700 as discussed herein is immersed in low-boiling point liquid 802. In some embodiments, IC dies or systems 100, 700 as deployed in two-phase immersion cooling system 800 do not include additional active cooling structures, although such die-level or package-level active cooling structures may be used in concert with two-phase immersion cooling system 800. In some embodiments, when deployed in two-phase immersion cooling system 800, package-level active-cooling structure 788 is a heat sink, a heat dissipation plate, a porous heat dissipation plate or the like.

Notably, IC die 702 (or IC die 100), is the source of heat in the context of two-phase immersion cooling system 800. For example, IC die 702 may be packaged and mounted on electronics substrate 805. Electronic substrate 805 may be coupled to a power supply (not shown) and may be partially or completely submerged in low-boiling point liquid 802.

In operation, the heat produced by heat generation source 804 vaporizes low-boiling point liquid 802 as shown in vapor or gas state as bubbles 806, which may collect, due to gravitational forces, above low-boiling point liquid 802 as a vapor portion 807 within fluid containment structure 801. Condensation structure 803 may extend through vapor portion 807. In some embodiments, condensation structure 803 is a heat exchanger having a number of tubes 808 with a cooling fluid (i.e., a fluid colder than the condensation point of vapor portion 807) shown by arrows 809 that may flow through tubes 808 to condense vapor portion 807 back to low-boiling point liquid 802. In the IC system of FIG. 8, package-level active-cooling structure 788 includes a passive cooling structure such as a heat sink for immersion in low-boiling point liquid 802.

Figure 9:
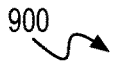
FIG. 9 illustrates various processes or methods for forming stacked SRAM cells with shared wordline connections on an IC die.
Figure 9:
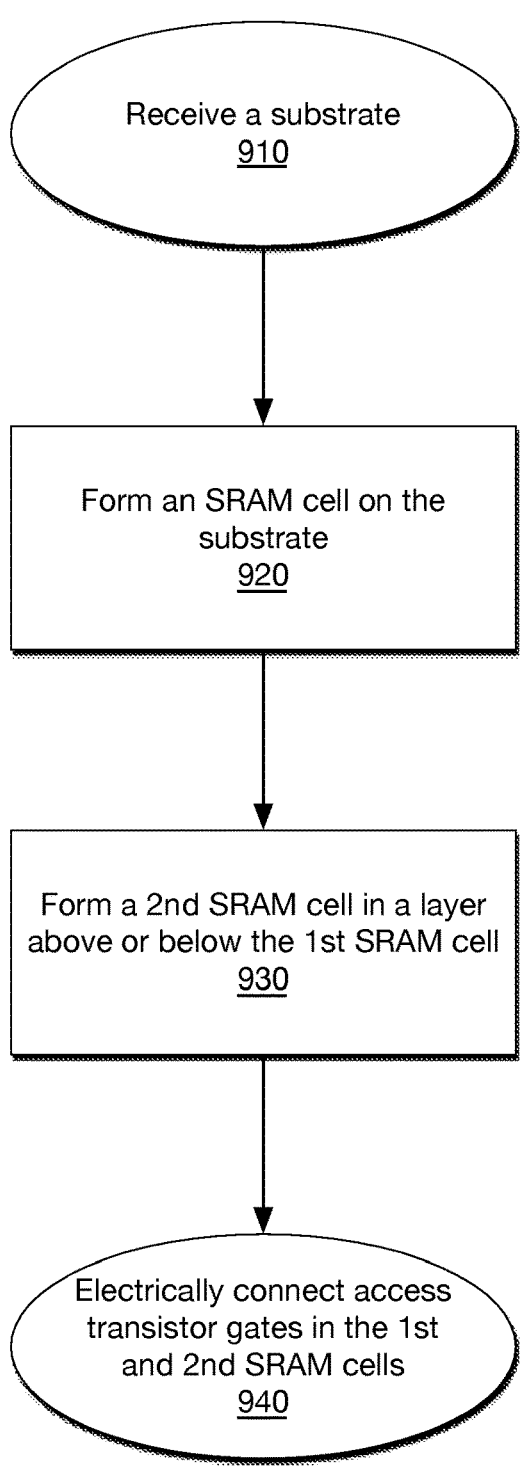

FIG. 9 illustrates various processes or methods 900 for forming stacked SRAM cells with shared wordline connections on an IC die, in accordance with some embodiments. FIG. 9 shows methods 900 that includes operations 910-940. Some operations shown in FIG. 9 are optional. FIG. 9 shows an example sequence, but the operations can be done in other sequences as well, and some operations may be omitted. Some operations can also be performed multiple times before other operations are performed. Some operations may be included within other operations. Methods 900 generally entail forming stacked SRAM cells and shared wordline connections between the SRAM cells.

In operation 910, a substrate is received for forming SRAM cells. The substrate is a planar platform and may already include dielectric and metallization structures. The substrate may be one of many layers in an IC die, and may itself have many layers. The substrate may be above other layers in the IC die (all or of a portion of which may be subsequently removed in back-side metallization contexts), and other layers may subsequently be formed in or over the substrate. In some embodiments, SRAM cells will be formed on a frontside of the substrate. In some embodiments, SRAM cells will be formed on a backside. In some embodiments, SRAM cells will be formed on both sides.

The substrate may include any suitable material or materials. Any suitable semiconductor or other material can be used. Transistors in the SRAM cells may be of the same material as the substrate or, e.g., deposited on the substrate. The substrate may include a semiconductor material that transistors can be formed out of and on, including a crystalline material. In some examples, the substrate may include monocrystalline silicon (Si), germanium (Ge), silicon germanium (SiGe), a III-V alloy material (e.g., gallium arsenide (GaAs)), a silicon carbide (SiC), a sapphire ($Al_2O_3$), or any combination thereof. In some embodiments, the substrate includes crystalline silicon and subsequent components are also silicon.

In operation 920, a first SRAM cell is formed on the substrate. The first SRAM cell need not be formed before, e.g., a second SRAM cell. Forming the SRAM cell may include forming transistors, resistors, and interconnections, e.g., between them and with external structures, including power, signal, data, ground, etc. lines. At least some of these structures may be conventional and known methods may be used.

Transistors in the SRAM cells can be formed from the same material as the substrate or, e.g., deposited on the substrate. In some embodiments, the substrate is crystalline silicon and transistors in the SRAM cells are formed by etching back the substrate to form transistor structures, e.g., non-planar structures, such as fins for access transistor channels. In some embodiments, transistors comprise polycrystalline silicon, which may be deposited over other materials. Other semiconductor materials may be deposited as well, on the substrate or over other structures on the substrate. Such semiconductor materials can be any material suitable for forming a transistor channel, e.g., for an access transistor, but some materials will be preferred for their manufacturing properties, e.g., the capability to be deposited easily, in a well-controlled manner, and in thin layers.

Forming SRAM cells may include forming ultrathin structures, such as nanowires, nanoribbons, or nanosheets, for transistor channels. In some embodiments, one or a few monolayers of semiconductor materials are deposited over the substrate or other structures. In some embodiments, less than 2 nm of semiconductor material is deposited as a film. In some embodiments, a transition-metal dichalcogenide (TMD) material is deposited to form access transistors. TMDs can be 2D materials, e.g., forming monolayers of semiconductor materials. 2D materials may be deposited on structures, such as backbone features, deposited on the substrate.

The methods for forming transistors may vary with transistor function. TFTs for use as pull-up transistors may be formed as parasitic devices deposited over other structures in some SRAM cells. In some embodiments, forming transistors includes depositing amorphous or polycrystalline metal oxides. In some embodiments, a thin, metal-oxide film is deposited that may be semiconducting substantially as-deposited, and/or following some subsequent activation process, such as a thermal anneal.

Other structures, e.g., resistors and metallization, may also be deposited or otherwise formed from such materials, and such forming may be done throughout the forming operations of transistors and other structures. Pull-up resistors may be formed from the substrate material or, e.g., by depositing polycrystalline silicon or other material over the substrate. Other structures, e.g., access transistor gate electrodes, may be formed such that convenient connections can be made to associated structures in vertically aligned SRAM cells. Metallization may be formed before and after, and interleaved throughout, the forming of other structures.

In operation 930, a second SRAM cell is formed in or on the substrate and in a layer vertically adjacent the layer of the first SRAM cell. The second SRAM cell may be formed before or after the first SRAM cell, above or below the first SRAM cell. The first or second SRAM cell may be formed in a layer before the layer of the other SRAM cell is formed.

The second SRAM cell may be formed in a similar manner as the first SRAM cell. Deposited structures in the second SRAM cell may be deposited over the top of the first SRAM cell, e.g., after an insulating layer is formed over the first SRAM cell. Structures formed, e.g., etched, from a front side of the substrate in the first SRAM cell may be formed, e.g., etched, from a back side of the substrate in the second SRAM cell. Layouts may be duplicated or mirrored as suits an embodiment. In some embodiments, an upper SRAM cell may be duplicated over a lower SRAM cell. In some embodiments, a lower SRAM cell layout on a back side may mirror an upper SRAM cell layout on a front side such that the corresponding cell components are vertically aligned.

In operation 940, the first and second SRAM cells are electrically connected. Specifically, they are connected by a common wordline at the gate electrodes of at least one access transistor in each SRAM cell. In some embodiments, two SRAM cells (and more) are formed in vertically adjacent layers with their access transistors connected at their gate electrodes by a common wordline, and portions of the wordline in different metallization layers are connected between layers by forming a vertical metallization structure, e.g., a metallized via connection, on one side of the layers, beyond the horizontal edges or boundaries of the SRAM cells. In some such embodiments, a deep border via connects the different metallization layers. In some embodiments, two of these connected SRAM cells are vertically aligned, and other connected SRAM cells in both layers are not vertically aligned. The vertical metallization structure, e.g., a via, can be formed as part of traditional or other methods, e.g. single or dual damascene techniques, etc.

In some embodiments, SRAM cells in the same word are in vertically adjacent layers and the gate electrodes of their access transistors are connected by forming a vertical metallization structure between layers and within the horizontal perimeters of the SRAM cells that directly contacts the vertically aligned gate electrodes. In some such embodiments, an upper SRAM cell (i.e., in an upper layer) is on a front side of the substrate, and a lower SRAM cell (i.e., in a lower layer) is on a back side of the substrate. In some of these embodiments, the entire SRAM cells are vertically aligned. In some embodiments, vertically aligned and vertically adjacent SRAM cells within a word are connected to parallel wordlines in different layers that are connected between layers by a deep border via metallization structure laterally beyond the SRAM cells. Many connection schemes are suitable.

Figure 10:
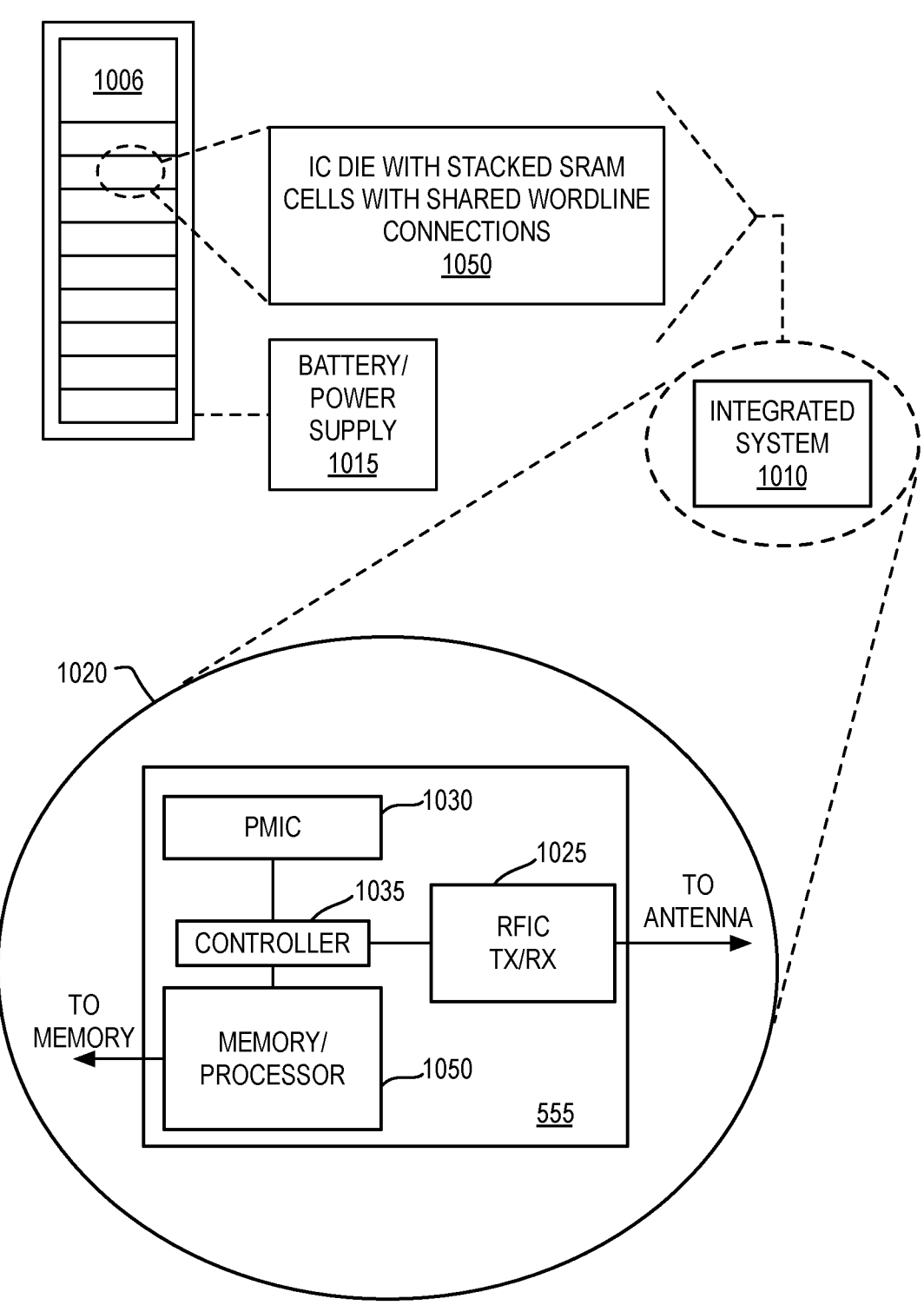
FIG. 10 illustrates a diagram of an example data server machine employing an IC die with stacked SRAM having shared wordline connections.

FIG. 10 illustrates a diagram of an example data server machine 1006 employing an IC die with stacked SRAM having shared wordline connections, in accordance with some embodiments. Server machine 1006 may be any commercial server, for example, including any number of high-performance computing platforms disposed within a rack and networked together for electronic data processing, which in the exemplary embodiment includes one or more devices 1050 having stacked SRAM with shared wordline connections.

Also as shown, server machine 1006 includes a battery and/or power supply 1015 to provide power to devices 1050, and to provide, in some embodiments, power delivery functions such as power regulation. Devices 1050 may be deployed as part of a package-level integrated system 1010. Integrated system 1010 is further illustrated in the expanded view 1020. In the exemplary embodiment, devices 1050 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1050 is a microprocessor including an SRAM cache memory. As shown, device 1050 may be a multi-chip module employing one or more IC dies with stacked SRAM having shared wordline connections, as discussed herein. Device 1050 may be further coupled to (e.g., communicatively coupled to) a board, an interposer, or a substrate 555 along with, one or more of a power management IC (PMIC) 1030, RF (wireless) IC (RFIC) 1025, including a wideband RF (wireless) transmitter and/or receiver (TX/RX) (e.g., including a digital baseband and an analog front end module further comprises a power amplifier on a transmit path and a low noise amplifier on a receive path), and a controller 1035 thereof. In some embodiments, RFIC 1025, PMIC 1030, controller 1035, and device 1050 include IC dies having stacked SRAM with shared wordline connections on substrate 555 in a multi-chip module.

Figure 11:
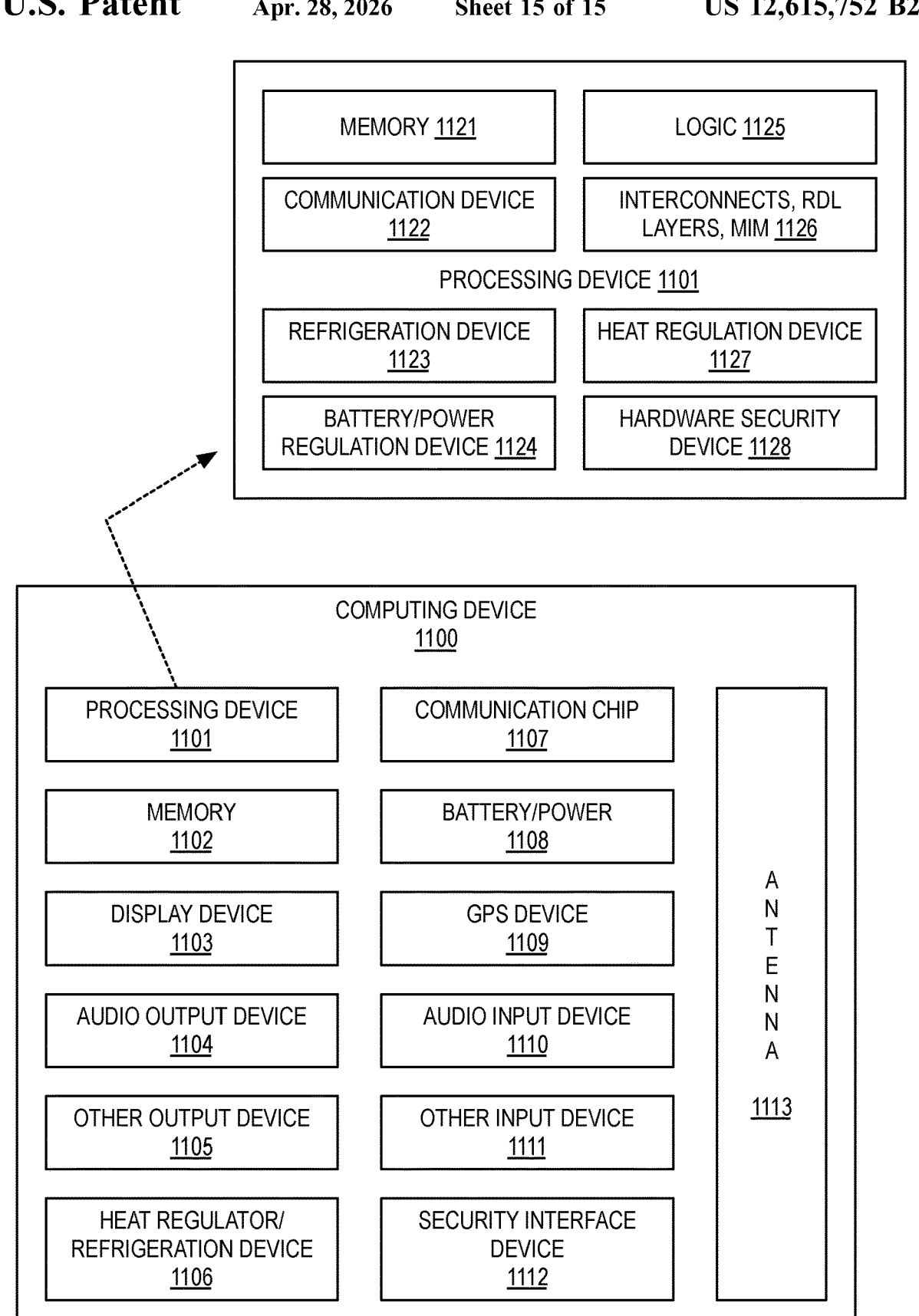
FIG. 11 is a block diagram of an example computing device, all in accordance with at least some implementations of the present disclosure.

FIG. 11 is a block diagram of an example computing device 1100, in accordance with some embodiments. For example, one or more components of computing device 1100 may include any of the devices or structures discussed herein. A number of components are illustrated in FIG. 11 as being included in computing device 1100, but any one or more of these components may be omitted or duplicated, as suitable for the application. In some embodiments, some or all of the components included in computing device 1100 may be attached to one or more printed circuit boards (e.g., a motherboard). In some embodiments, various ones of these components may be fabricated onto a single system-on-a-chip (SoC) die. Additionally, in various embodiments, computing device 1100 may not include one or more of the components illustrated in FIG. 11, but computing device 1100 may include interface circuitry for coupling to the one or more components. For example, computing device 1100 may not include a display device 1103, but may include display device interface circuitry (e.g., a connector and driver circuitry) to which display device 1103 may be coupled. In another set of examples, computing device 1100 may not include an audio output device 1104, other output device 1105, global positioning system (GPS) device 1109, audio input device 1110, or other input device 1111, but may include audio output device interface circuitry, other output device interface circuitry, GPS device interface circuitry, audio input device interface circuitry, audio input device interface circuitry, to which audio output device 1104, other output device 1105, GPS device 1109, audio input device 1110, or other input device 1111 may be coupled.

Computing device 1100 may include a processing device 1101 (e.g., one or more processing devices). As used herein, the term "processing device" or "processor" indicates a device that processes electronic data from registers and/or memory (such as SRAM) to transform that electronic data into other electronic data that may be stored in registers and/or memory (e.g., SRAM). Processing device 1101 may include a memory 1121 (itself including SRAM), a communication device 1122, a refrigeration device 1123, a battery/power regulation device 1124, logic 1125, interconnects 1126 (i.e., optionally including redistribution layers (RDL) or metal-insulator-metal (MIM) devices), a heat regulation device 1127, and a hardware security device 1128.

Processing device 1101 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 1100 may include a memory 1102, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1102 includes memory that shares a die with processing device 1101. This memory may be used as cache memory and may include embedded dynamic random-access memory (eDRAM) or spin transfer torque magnetic random-access memory (STT-M RAM).

Computing device 1100 may include a heat regulation/refrigeration device 1106. Heat regulation/refrigeration device 1106 may maintain processing device 1101 (and/or other components of computing device 1100) at a predetermined low temperature during operation. This predetermined low temperature may be any temperature discussed herein.

In some embodiments, computing device 1100 may include a communication chip 1107 (e.g., one or more communication chips). For example, the communication chip 1107 may be configured for managing wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1107 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1107 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1107 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1107 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1107 may operate in accordance with other wireless protocols in other embodiments. Computing device 1100 may include an antenna 1113 to facilitate wireless communications and/or to receive other wireless communications (such as AM or FM radio transmissions).

In some embodiments, communication chip 1107 may manage wired communications, such as electrical, optical, or any other suitable communication protocols (e.g., the Ethernet). As noted above, communication chip 1107 may include multiple communication chips. For instance, a first communication chip 1107 may be dedicated to shorter-range wireless communications such as Wi-Fi or Bluetooth, and a second communication chip 1107 may be dedicated to longer-range wireless communications such as GPS, EDGE, GPRS, CDMA, WiMAX, LTE, EV-DO, or others. In some embodiments, a first communication chip 1107 may be dedicated to wireless communications, and a second communication chip 1107 may be dedicated to wired communications.

Computing device 1100 may include battery/power circuitry 1108. Battery/power circuitry 1108 may include one or more energy storage devices (e.g., batteries or capacitors) and/or circuitry for coupling components of computing device 1100 to an energy source separate from computing device 1100 (e.g., AC line power).

Computing device 1100 may include a display device 1103 (or corresponding interface circuitry, as discussed above). Display device 1103 may include any visual indicators, such as a heads-up display, a computer monitor, a projector, a touchscreen display, a liquid crystal display (LCD), a light-emitting diode display, or a flat panel display, for example.

Computing device 1100 may include an audio output device 1104 (or corresponding interface circuitry, as discussed above). Audio output device 1104 may include any device that generates an audible indicator, such as speakers, headsets, or earbuds, for example.

Computing device 1100 may include an audio input device 1110 (or corresponding interface circuitry, as discussed above). Audio input device 1110 may include any device that generates a signal representative of a sound, such as microphones, microphone arrays, or digital instruments (e.g., instruments having a musical instrument digital interface (MIDI) output).

Computing device 1100 may include a GPS device 1109 (or corresponding interface circuitry, as discussed above). GPS device 1109 may be in communication with a satellite-based system and may receive a location of computing device 1100, as known in the art.

Computing device 1100 may include other output device 1105 (or corresponding interface circuitry, as discussed above). Examples of the other output device 1105 may include an audio codec, a video codec, a printer, a wired or wireless transmitter for providing information to other devices, or an additional storage device.

Computing device 1100 may include other input device 1111 (or corresponding interface circuitry, as discussed above). Examples of the other input device 1111 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1100 may include a security interface device 1112. Security interface device 1112 may include any device that provides security measures for computing device 1100 such as intrusion detection, biometric validation, security encode or decode, access list management, malware detection, or spyware detection.

Computing device 1100, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-11. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, an IC die comprises a first SRAM cell in a first device layer, the first SRAM cell comprising a first access transistor, a second SRAM cell in a second device layer below the first device layer, the second SRAM cell vertically aligned with the first SRAM cell, the second SRAM cell comprising a second access transistor, and a metallization structure electrically connecting a gate electrode of the first access transistor to a gate electrode of the second access transistor.

In one or more second embodiments, further to the first embodiments, the metallization structure comprises a substantially vertical portion external to a horizontal boundary of the first SRAM cell.

In one or more third embodiments, further to the first or second embodiments, the metallization structure directly contacts the gate electrode of the first access transistor and the gate electrode of the second access transistor, the metallization structure substantially vertical and internal to a horizontal boundary of the first SRAM cell.

In one or more fourth embodiments, further to the first through third embodiments, the first SRAM cell comprises four transistors and the second SRAM cell comprises four transistors.

In one or more fifth embodiments, further to the first through fourth embodiments, the first SRAM cell comprises two resistors and the second SRAM cell comprises two resistors, the resistors comprising polycrystalline silicon.

In one or more sixth embodiments, further to the first through fifth embodiments, the first SRAM cell comprises six transistors and the second SRAM cell comprises six transistors.

In one or more seventh embodiments, further to the first through sixth embodiments, the first or second access transistor is a non-planar FET.

In one or more eighth embodiments, further to the first through seventh embodiments, a channel of the first or second access transistor comprises a nanowire or nanosheet.

In one or more ninth embodiments, a system comprises a substrate, a power supply, and an IC die attached to the substrate and coupled to the power supply, the IC die comprising first and second SRAM circuits in vertically stacked device layers, the first and second SRAM circuits connected by a common word line extending vertically between the stacked device layers.

In one or more tenth embodiments, further to the ninth embodiments, the first SRAM circuit comprises a non-planar FET.

In one or more eleventh embodiments, further to the ninth or tenth embodiments, a channel of the non-planar FET comprises a nanowire or nanosheet.

In one or more twelfth embodiments, further to the ninth through eleventh embodiments, the common word line comprises a substantially vertical via connection between vertically adjacent metallization layers.

In one or more thirteenth embodiments, further to the ninth through twelfth embodiments, the common word line comprises a connection between a first gate electrode in the first SRAM circuit and a second gate electrode in the second SRAM circuit, the first gate electrode and the second gate electrode being vertically aligned.

In one or more fourteenth embodiments, further to the ninth through thirteenth embodiments, the system comprises or is thermally coupled to a cooling structure, the cooling structure operable to remove heat from an IC die to achieve an operating temperature at or below −25° C.

In one or more fifteenth embodiments, further to the ninth through fourteenth embodiments, the first SRAM circuit comprises a transistor having a channel thickness of not more than 2 nm.

In one or more sixteenth embodiments, a method comprises receiving a substrate, forming a first SRAM cell in a first layer over the substrate, forming a second SRAM cell in a second layer over the substrate, the second layer vertically adjacent the first layer, and electrically connecting a first access transistor gate electrode of the first SRAM cell to a second access transistor gate electrode of the second SRAM cell.

In one or more seventeenth embodiments, further to the sixteenth embodiments, the second SRAM cell is above or below and vertically aligned with the first SRAM cell.

In one or more eighteenth embodiments, further to the sixteenth or seventeenth embodiments, said electrically connecting comprises forming a metallization structure between a first metallization layer and a second metallization layer, the metallization structure laterally beyond a horizontal edge of the first SRAM cell.

In one or more nineteenth embodiments, further to the sixteenth through eighteenth embodiments, said electrically connecting comprises forming a metallization structure directly connecting the first access transistor gate electrode to the second access transistor gate electrode, the metallization structure within a horizontal perimeter of the first SRAM cell.

In one or more twentieth embodiments, further to the sixteenth through nineteenth embodiments, the first layer is on a front side of the substrate and the second layer is on a backside of the substrate.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An apparatus, comprising:
a first static random-access memory (SRAM) cell in a first device layer of an integrated circuit (IC) die, the first SRAM cell comprising a first access transistor comprising a first gate electrode;
a second SRAM cell in a second device layer of the IC die below the first device layer, the second SRAM cell vertically aligned with the first SRAM cell, the second SRAM cell comprising a second access transistor comprising a second gate electrode vertically aligned with the first gate electrode; and
a metallization structure electrically connecting the first gate electrode to the second gate electrode, the metallization structure comprising a substantially vertical portion in contact with a sidewall of the first gate electrode and a sidewall of the second gate electrode.

2. The apparatus of claim 1, wherein the metallization structure is absent on top of the first gate electrode and absent on top of the second gate electrode.

3. The apparatus of claim 1, wherein a top of the first gate electrode, a top of the second gate electrode, a second sidewall of the first gate electrode, opposite the sidewall of the first gate electrode, and a second sidewall of the second gate electrode, opposite the sidewall of the second gate electrode, are in contact with a dielectric material.

4. The apparatus of claim 1, further comprising: a substrate between the first gate electrode and the second gate electrode.

5. The apparatus of claim 1, wherein the first SRAM cell comprises at least four transistors and the second SRAM cell comprises at least four transistors.

6. The apparatus of claim 5, wherein the first SRAM cell comprises two resistors and the second SRAM cell comprises two resistors, the resistors comprising polycrystalline silicon.

7. The apparatus of claim 5, wherein the first SRAM cell comprises six transistors and the second SRAM cell comprises six transistors.

8. The apparatus of claim 1, wherein the first access transistor or the second access transistor is a non-planar field-effect transistor (FET).

9. The apparatus of claim 8, wherein a channel of the non-planar FET comprises a nanowire or a nanosheet.

10. The apparatus of claim 1, further comprising:
a power supply coupled to the IC die.

11. An apparatus, comprising:
a first static random-access memory (SRAM) circuit and a second SRAM circuit in vertically stacked device layers of an integrated circuit (IC) die, the first SRAM circuit comprising a first access transistor comprising a first gate electrode, and the second SRAM circuit comprising a second access transistor comprising a second gate electrode vertically aligned with the first gate electrode; and a common word line extending vertically between the vertically stacked device layers and electrically connecting the first gate electrode to the second gate electrode, the common word line comprising a metallization structure comprising a substantially vertical portion in contact with a sidewall of the first gate electrode and a sidewall of the second gate electrode.

12. The apparatus of claim 11, wherein the metallization structure is absent on top of the first gate electrode and absent on top of the second gate electrode.

13. The apparatus of claim 11, wherein a top of the first gate electrode, a top of the second gate electrode, a second sidewall of the first gate electrode, opposite the sidewall of the first gate electrode, and a second sidewall of the second gate electrode, opposite the sidewall of the second gate electrode, are in contact with a dielectric material.

14. The apparatus of claim 11, further comprising:
a substrate between the first gate electrode and the second gate electrode.

15. The apparatus of claim 11, wherein the first SRAM circuit comprises a first SRAM cell comprising at least four transistors and the second SRAM circuit comprises a second SRAM cell comprising at least four transistors.

16. The apparatus of claim 15, wherein the first SRAM cell comprises two resistors and the second SRAM cell comprises two resistors, the resistors comprising polycrystalline silicon.

17. The apparatus of claim 15, wherein the first SRAM cell comprises six transistors and the second SRAM cell comprises six transistors.

18. The apparatus of claim 11, wherein the first access transistor or the second access transistor is a non-planar field-effect transistor (FET).

19. The apparatus of claim 18, wherein a channel of the non-planar FET comprises a nanowire or a nanosheet.

20. The apparatus of claim 11, further comprising:
a power supply coupled to the IC die.

* * * * *